(12) United States Patent
Tomoeda et al.

(10) Patent No.: US 7,969,200 B2
(45) Date of Patent: Jun. 28, 2011

(54) DECODER CIRCUIT

(75) Inventors: Mitsuhiro Tomoeda, Itami (JP);
Makoto Muneyasu, Tokyo (JP);
Masahiro Hosoda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/845,290

(22) Filed: Jul. 28, 2010

(65) Prior Publication Data
US 2010/0301902 A1    Dec. 2, 2010

Related U.S. Application Data

(63) Continuation of application No. 12/361,755, filed on Jan. 29, 2009, now Pat. No. 7,795,922.

(30) Foreign Application Priority Data

Mar. 24, 2008   (JP) .................................. 2008-075351

(51) Int. Cl.
G11C 8/00      (2006.01)
H03K 19/082    (2006.01)
H03K 19/094    (2006.01)

(52) U.S. Cl. ......................... 326/105; 326/106; 326/108

(58) Field of Classification Search .................... 326/68, 326/81, 105–108; 365/189.09, 189.11, 230.06
See application file for complete search history.

(56) References Cited

U.S. PATENT DOCUMENTS 4,893,275 A * 1/1990 Tanaka et al. ............ 365/185.23
5,781,497 A * 7/1998 Patel et al. ............... 365/230.06
5,808,482 A    9/1998 Rountree

FOREIGN PATENT DOCUMENTS

JP    2001-101881    4/2001

* cited by examiner

Primary Examiner — Anh Q Tran
(74) Attorney, Agent, or Firm — McDermott Will & Emery LLP

(57) ABSTRACT

A normally operable decoder circuit is obtained without entailing a delay in decoding operation, an increase in circuit area, and an increase in circuit design cost. An NMOS transistor in a high-voltage circuit portion is inserted between the output of a NAND gate and a node, and receives an input signal at the gate electrode thereof. A load current generating portion in the high-voltage circuit portion includes PMOS transistors coupled in series between a high power supply voltage and the node. One of the PMOS transistor receives a control signal at the gate electrode thereof. The other PMOS transistor receives a control signal at the gate electrode thereof. An inverter receives a signal obtained from the node as an input signal, and outputs the inverted signal thereof as an output signal.

2 Claims, 17 Drawing Sheets

WRITE OPERATION

ERASE OPERATION

FIG. 8

| VOLTAGE LEVEL OF VP | | ADDRESS FOR WL SELECTION | | |
|---|---|---|---|---|
| | | SELECTION OF ONE ADDRESS | SELECTION OF EVEN-NUMBERED OR ODD-NUMBERED ADDRESS | SELECTION OF ALL ADDRESSES |
| | PMOS ON-STATE BREAKDOWN VOLTAGE OR MORE | WRITE PROCESS WRITE VERIFY PROCESS | | PRE-ERASE WRITE PROCESS |
| | VOLTAGE LEVEL OF PMOS ON-STATE BREAKDOWN VOLTAGE OR LESS TO VD | READ OPERATION | TEST MODE | |
| | VOLTAGE LEVEL OF VD OR LESS | ERASE VERIFY PROCESS | | ERASE PROCESS |

FIG. 9

| VD | POWER SUPPLY FOR LOW-VOLTAGE MOS |
|---|---|
| VS | GND |
| VH | PMOS ON-STATE BREAKDOWN VOLTAGE OR MORE |
| VM | VOLTAGE LEVEL OF PMOS ON-STATE BREAKDOWN VOLTAGE OR LESS TO VD |
| VL | VOLTAGE LEVEL OF VD OR LESS TO VS OR MORE |
| VNH | NEGATIVE HIGH VOLTAGE |

FIG. 10

| OPERATION STATE OF FLASH MEMORY | | READ | WRITE | WRITE VERIFY | PRE-ERASE WRITE | ERASE | ERASE VERIFY |
|---|---|---|---|---|---|---|---|
| SELECTED BLOCK | ADDRESS SELECTION | SELECTION OF ONE ADDRESS | SELECTION OF ONE ADDRESS | SELECTION OF ONE ADDRESS | SELECTION OF ALL ADDRESSES | SELECTION OF ALL ADDRESSES | SELECTION OF ONE ADDRESS |
| | VOLTAGE LEVEL OF VP | VM | VH | VH | VH | VL | VL |
| | VOLTAGE LEVEL OF VP1 | VM | VH | VH | VD | VS | VL |
| | SL1 | VD | VD | VD | VD | VS | VS |
| | SL2e | VD | VM | VM | VH | VL | VS |
| | SL2o | VD | VM | VM | VH | VL | VL |
| | SL3 | VM | VH | VH | VH | VL | VS |
| | VOLTAGE LEVEL OF VN | VS | VS | VS | VS | VNH | VS |
| NON-SELECTED BLOCK | ADDRESS SELECTION | SELECTION OF NO ADDRESS | SELECTION OF NO ADDRESS | SELECTION OF NO ADDRESS | SELECTION OF NO ADDRESS | SELECTION OF NO ADDRESS | SELECTION OF NO ADDRESS |
| | VOLTAGE LEVEL OF VP | VM | VH | VH | VH | VL | VL |
| | VOLTAGE LEVEL OF VP1 | VM | VS | VS | VS | VS | VS |
| | SL1 | VD | VD | VD | VD | VS | VS |
| | SL2e | VD | VM | VM | VM | VS | VS |
| | SL2o | VD | VM | VM | VS | VS | VS |
| | SL3 | VS(puls)/VM | VH | VH | VH | VL | VL |
| | VOLTAGE LEVEL OF VN | VS | VS | VS | VS | VS | VS |

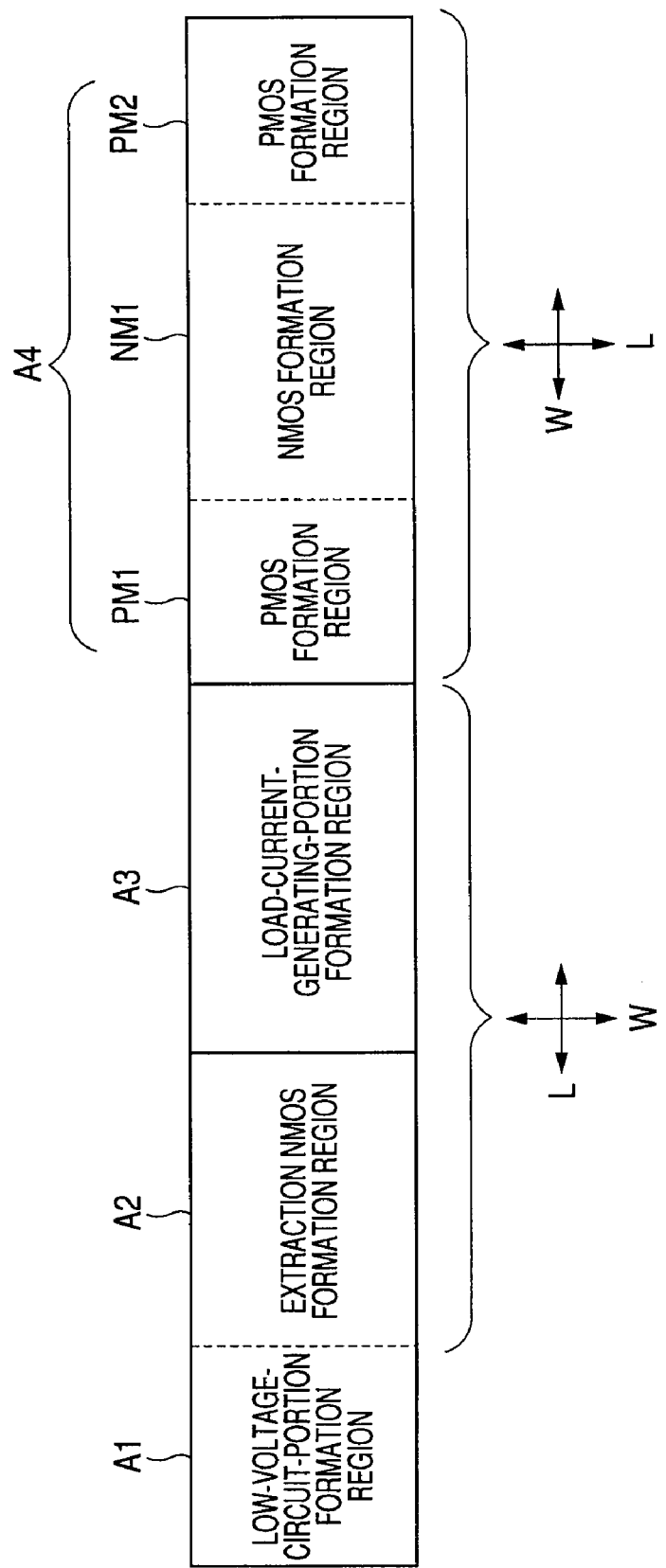

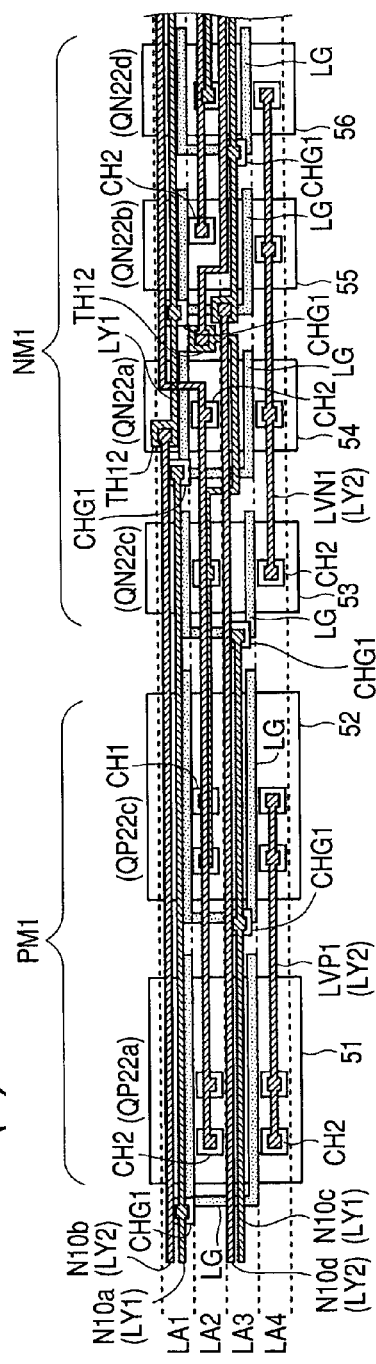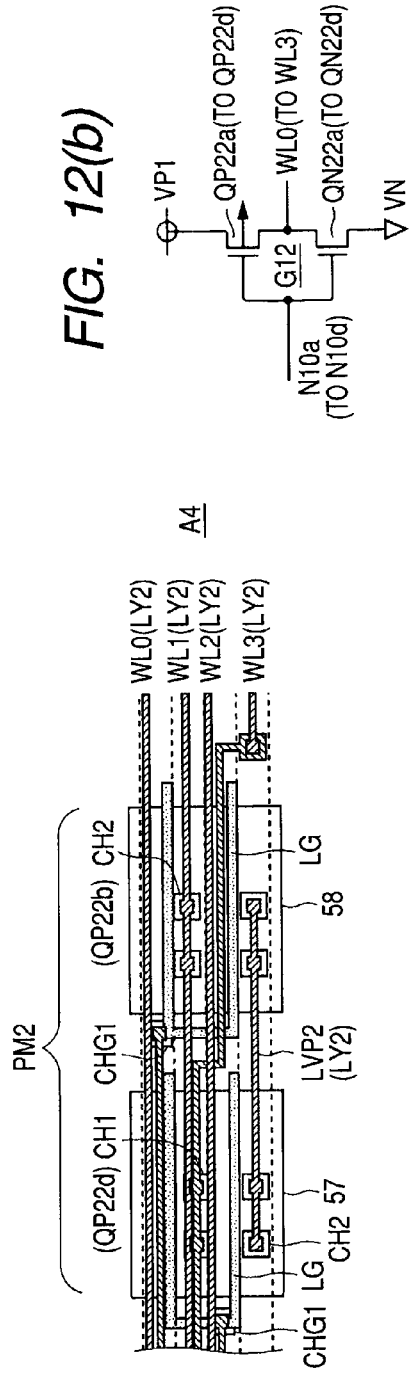
FIG. 12(a)
FIG. 12(b)

FIG. 16

| OPERATION STATE OF FLASH MEMORY | READ | WRITE | WRITE VERIFY | PRE-ERASE WRITE | ERASE | ERASE VERIFY |
|---|---|---|---|---|---|---|
| SELECTED BLOCK | | | | | | |
| ADDRESS SELECTION | SELECTION OF ONE ADDRESS | SELECTION OF ONE ADDRESS | SELECTION OF ONE ADDRESS | SELECTION OF ALL ADDRESSES | SELECTION OF ALL ADDRESSES | SELECTION OF ONE ADDRESS |
| VOLTAGE LEVEL OF VP | VM | VH | VH | VH | VL | VL |
| VOLTAGE LEVEL OF VP1 | VM | VH | VH | VH | VS | VL |
| SL1 | VD | VD | VD | VD | VS | VS |
| SL2 | VD | VM | VM | VH | VS | VS |
| SL3 | VM | VH | VH | VH | VL | VL |
| VOLTAGE LEVEL OF VN | VS | VS | VS | VS | VNH | VS |
| NON-SELECTED BLOCK | | | | | | |
| ADDRESS SELECTION | SELECTION OF NO ADDRESS | SELECTION OF NO ADDRESS | SELECTION OF NO ADDRESS | SELECTION OF NO ADDRESS | SELECTION OF NO ADDRESS | SELECTION OF NO ADDRESS |
| VOLTAGE LEVEL OF VP | VM | VH | VH | VH | VL | VL |
| VOLTAGE LEVEL OF VP1 | VM | VS | VS | VS | VS | VS |
| SL1 | VD | VD | VD | VD | VS | VS |
| SL2 | VD | VM | VM | VM | VS | VS |
| SL3 | VS(puls)/VM | VH | VH | VH | VL | VL |
| VOLTAGE LEVEL OF VN | VS | VS | VS | VS | VS | VS |

DECODER CIRCUIT

CROSS-REFERENCE TO RELATED APPLICATIONS

This application is a Continuation of U.S. patent application Ser. No. 12/361,755, filed on Jan. 29, 2009 now U.S. Pat. No. 7,795,922, claiming priority of Japanese Patent Application No. 2008-75351, filed on Mar. 24, 2008, the entire contents of each of which are hereby incorporated by reference.

BACKGROUND OF THE INVENTION

The present invention relates to a decoder circuit used in a semiconductor memory device.

FIG. 17 is a circuit diagram showing a structure of a part of a decoder circuit as a first conventional circuit or the like which is used in a semiconductor memory device used as a versatile memory product.

As shown in the drawing, the first conventional circuit is comprised of a high-voltage circuit portion 21 and a low-voltage circuit portion 25. The low-voltage circuit portion 25 performs a low-voltage operation using a low power supply voltage VD of about 1.5 V and a GND voltage VS of about 0 V as a "H" level and a "L" level, respectively. The high-voltage circuit portion 21 performs a high-voltage operation using a high power supply voltage VP of about 5 to 10 V and a negative-side power supply voltage VN of 0 V to a negative high voltage level as the "H" level and the "L" level, respectively.

The low-voltage circuit portion 25 is comprised of a 3-input NAND gate G21, receives input signals IN22 to IN24, and outputs the output signal thereof to the high-voltage circuit portion 21. An input signal IN21 is directly outputted to the high-voltage circuit portion 21 without any alteration.

The high-voltage circuit portion 21 is comprised of a load current generating portion 31, an NMOS transistor QN31, and an inverter G22. In the NMOS transistor QN31, one electrode receives the output of the NAND gate G21, the other electrode is coupled to a node N31, and a gate electrode receives the input signal IN21.

The load current generating portion 31 is comprised of a PMOS transistor QP31. In the PMOS transistor QP31, one electrode receives the high power supply voltage VP, a gate electrode receives a (load current) control signal SC21, and the other electrode is coupled to the node N31, i.e., the other electrode of the NMOS transistor QN31. Because the control signal SC21 is constantly fixed to the "L" level (negative-side power supply voltage VN), the PMOS transistor QP31 is in a normally-ON state so that the high power supply voltage VP is constantly imparted to the node N31.

However, the first conventional circuit according to the first embodiment is designed to satisfy a first operation condition under which, when the output of the NAND gate G21 is on the "L" level (GND voltage VS), the ("L"-level) driving forces of the NAND gate G21 and the NMOS transistor QN31 exceed the driving force of the PMOS transistor QP31 to forcibly set the node N31 to the GND voltage VS. For example, by setting the gate width of each of MOS transistors (particularly the MOS transistor for setting the GND voltage VS) configuring the NAND gate G21 and the NMOS transistor QN31 to a value larger than that of the PMOS transistor QP31 or the like, a structure which satisfies the foregoing first operation condition is implemented.

The inverter G22 is implemented by a CMOS structure comprised of a PMOS transistor QP32 and an NMOS transistor QN32 which are coupled in series to share a gate electrode. That is, the one electrode of the PMOS transistor QP32 receives the high power supply voltage VP, the one electrode of the NMOS transistor QN32 receives the negative-side power supply voltage VN, and the shared gate electrode of both of the PMOS transistor QP32 and the NMOS transistor QN32 is coupled to the node N31. A signal obtained from the other electrode of the PMOS transistor QP31 (NMOS transistor QN31) is outputted as an output signal OUT21. The output signal OUT21 drives a word line or the like.

FIG. 18 is a waveform diagram showing an operation of the first conventional circuit. Referring to the drawing, a decoding operation of the first conventional circuit will be described hereinbelow.

During a non-selected state, at least one of the input signals IN21 to IN24 which are predecode signals is on the "L" level, and the output of the NAND gate G21 is on the "H" level, or the NMOS transistor QN31 is in an OFF state so that there is no extraction of the potential of the node N31 to the "L" level. Accordingly, the potential of the node N31 is set to the high power supply voltage VP by a charging operation by the PMOS transistor QP31 in the normally-ON state.

As a result, the "L" level (negative-side power supply voltage VN) is outputted as the output signal OUT21 from the inverter G22 to bring the word line which receives the output signal OUT21 or the like into the non-selected state.

On the other hand, during a selected state, the input signals IN21 to IN24 are all on the "H" level, the output of the NAND gate G21 is set to the "L" level, and the NMOS transistor QN31 is in the ON state to satisfy the foregoing first operation condition. Accordingly, the potential of the node N31 is extracted to the "L" level (GND voltage VS).

As a result, the "H" level (high power supply voltage VP) is outputted as the output signal OUT21 from the inverter G22 to bring the word line which receives the output signal OUT21 or the like into the selected state.

Since the first conventional circuit thus structured performs the decoding operation while setting the PMOS transistor QP31 configuring the load current generating portion 31 to the normally-ON state, it follows that a through current is constantly generated between the high power supply voltage VP and the GND voltage VS in the selected state.

FIG. 19 is a circuit diagram showing a structure of a part of a decoder circuit as a second conventional circuit which is used in a semiconductor memory device used as a versatile memory product or the like. As for the same parts as those of the first conventional circuit shown in FIG. 17, the description thereof will be omitted appropriately by providing the same reference numerals.

As shown in the drawing, the second conventional circuit is comprised of a high-voltage circuit portion 22 and a low-voltage circuit portion 26. The low-voltage circuit portion 26 performs the same low-voltage operation as performed by the low-voltage circuit portion 25. The high-voltage circuit portion 22 performs the same high-voltage operation as performed by the high-voltage circuit portion 21.

The low-voltage circuit portion 26 is comprised of a 3-input NAND gate G23, receives input signals IN22 to IN24, and outputs the output signal thereof to the high-voltage circuit portion 22. An input signal IN21 is directly outputted to the high-voltage circuit portion 22 without any alteration.

The high-voltage circuit portion 22 is comprised of a load current generating portion 32, an NMOS transistor QN33, an inverter G22, and a PMOS transistor QP34. In the NMOS transistor QN33, one electrode receives the output of the NAND gate G23, the other electrode is coupled to a node N32, and a gate electrode receives the input IN21.

The load current generating portion 32 is comprised of a PMOS transistor QP33. In the PMOS transistor QP33, one electrode receives the high power supply voltage VP, a gate electrode receives a control signal SC22, and the other electrode is coupled to the node N32. The control signal SC22 is set to the "L" level (negative-side power supply voltage VN) only during a predetermined initial period after the initiation of each decoding operation, while it is set to the "H" level (high power supply voltage VP) during the other period.

The inverter G22 uses the node N32 as an input portion, and outputs an output signal OUT22 obtained by inverting a signal obtained from the node N32 from a node N33 as the other electrode of the PMOS transistor QP32 (NMOS transistor QN32).

In the PMOS transistor QP34, one electrode receives the high power supply voltage VP, a gate electrode is coupled to the node N33, and the other electrode is coupled to the node N32.

FIG. 20 is a waveform diagram showing an operation of the second conventional circuit. Referring to the drawing, a decoding operation of the second conventional circuit will be described hereinbelow.

In the second conventional circuit, the control signal SC22 is on the "L" level during the initial predetermined period after the initiation of each decoding operation, and the pre-process of charging the node N32 to the high power supply voltage VP is inevitably executed by the PMOS transistor QP33 which is in the ON state during this period.

During the non-selected state, after the pre-process mentioned above, at least one of the input signals IN21 to IN24 which are pre-decode signals becomes "L", and the output of the NAND gate G23 becomes "H", or the NMOS transistor QN33 is brought into the OFF state. Accordingly, the potential of the node N32 is not extracted to the "L" level, and is set to the high power supply voltage VP by a charging operation by the PMOS transistor QP33 in the pre-process.

As a result, the "L" level (negative-side power supply voltage VN) is outputted as the output signal OUT22 by the inverter G22 to bring the word line or the like which receives the output signal OUT22 into the non-selected state.

After the control signal SC22 has risen to the "H" level, the PMOS transistor QP33 is brought into the OFF state. However, the output signal OUT22 on the "L" level is imparted to the gate electrode of the PMOS transistor QP34 to allow the PMOS transistor QP34 in the ON state to keep the potential of the node N32 at the high power supply voltage VP. Therefore, even after the rise of the control signal SC22 to the "H" level, the output signal OUT22 retains the "L" level so that the non-selected state is maintained.

Thus, as a result of bringing the PMOS transistor QP34 which receives the output signal OUT22 of the inverter G22 at the gate electrode thereof into the ON state, the "L" level of the output signal OUT22 can be latched so that, even after the OFF state of the PMOS transistor QP3, the non-selected state is maintained.

On the other hand, during the selected state, after the pre-process mentioned above, all of the input signals IN21 to IN24 become "H", the output of the NAND gate G23 becomes "L", and the NMOS transistor QN33 is brought into the ON state so that the potential of the node N32 is extracted to the "L" level (GND voltage VS).

As a result, the "H" level (high power supply voltage VP) is outputted as the output signal OUT22 from the inverter G22 to bring the word line which receives the output signal OUT22 or the like into the selected state.

After the rise of the control signal SC22 to the "H" level, the output signal OUT22 on the "H" level is imparted to the gate electrode of the PMOS transistor QP34 to turn OFF the PMOS transistor QP34. As a result, the PMOS transistors QP33 and QP34 each for charging the node N32 to the high power supply voltage VP are both turned OFF. Therefore, there is no flow of a through current between the high power supply voltage VP and the negative-side power supply voltage VN during the selected state.

Thus, the PMOS transistor QP34 functions as a half latch which latches only the output signal OUT22 on the "L" level.

The second conventional circuit thus structured performs the decoding operation after keeping the PMOS transistor QP32 configuring the load current generating portion 32 in the ON state only for a predetermined period during the foregoing pre-process for the decoding operation. Therefore, unlike in the first conventional circuit, there is no occurrence of a through current to achieve lower power consumption. The second conventional circuit is disclosed in, e.g., Patent Document 1.

[Patent Document 1]
Japanese Unexamined Patent Publication No. 2001-101881

SUMMARY OF THE INVENTION

In the first conventional circuit described above in the selected state during the decoding operation, the high power supply voltage VP is applied between the source and drain of the PMOS transistor QP31 in the normally-ON state.

When the voltage level of the high power supply voltage VP is set higher than the ON-state breakdown voltage of the PMOS transistor QP31 (QP34), the problem occurs that the setting exceeds the ON-state breakdown voltage of the PMOS transistor QP31 to result in degraded reliability. This places a limit under which the voltage level of the high power supply voltage VP should be set to a value of not more than the ON-state breakdown voltage of the PMOS transistor QP31. The ON-state breakdown voltage indicates a voltage between the drain and source of a MOS transistor which breaks down in the ON state.

In the first conventional circuit shown in FIG. 17, when the voltage level of the high power supply voltage VP is increased, a load current flowing in the PMOS transistor QP31 undesirably increases to increase power consumption. Moreover, in order to reliably set the node N31 to the "L" level during the selected state, it has been necessary to satisfy the foregoing first operation condition, which is the extraction of the load current by the PMOS transistor QP31.

Therefore, increasing the voltage level of the high power supply voltage VP has the problem that, because it is necessary to increase the transistor size, such as gate width, of the NMOS transistor for setting the GND voltage VS among the MOS transistors configuring the NMOS transistor QN31 and the NAND gate G21, and thereby further increase a current driving ability, a layout area is increased accordingly thereby.

There is also a method for achieving lower power consumption in the first conventional circuit shown in FIG. 17, in which a load current supplying ability is reduced by reducing the gate width W of the PMOS transistor QP31, or increasing the gate length L thereof. By adopting the method, the through current during the selected state (OUT11=VP) can be reduced. However, when this method is used, a "L"-to-"H" transition TS11 at the node N31 delays due to the reduced load current supplying ability as shown in FIG. 18, so that a "H"-to-"L" transition TS12 of the output signal OUT21 also delays. In other words, there is the problem that, when the load current supplying ability is excessively reduced in the first conventional circuit, a decoding operation is delayed.

On the other hand, in the second conventional circuit shown in FIG. 19, the PMOS transistor QP34 configuring the half latch can be turned OFF in the selected state for the retention of charge in the node N32 during the non-selected state. This allows more effective suppression of the occurrence of a through current, and achieves lower power consumption than in the first conventional circuit.

However, it is general practice to adopt the second conventional circuit in the final stage (e.g., word line driver) of a row decoder circuit for a memory cell in a semiconductor memory device. In this case, it is necessary to provide extra wiring for causing the output signal OUT22 serving as a word-line drive signal to be feedbacked to the gate electrode of the PMOS transistor QP34. The need to provide the extra wiring renders it difficult to form a layout in accordance with the pitch of word lines. Thus, the second conventional circuit has the problem that the circuit area thereof is increased accordingly by the provision of the PMOS transistor QP34.

Under the influence of noise or the like, the potential of the node N32 may be inverted. However, the second conventional circuit includes the property that, when the potential of the node N32 is inverted by a misoperation of the PMOS transistor QP34 as the half latch, the inverted potential is not restored to the original level. Accordingly, the second conventional circuit has the problem that, when the PMOS transistor QP34 is provided, stringent design against noise is needed in consideration of the property mentioned above to result in increased design cost.

Thus, the second conventional circuit has the problem of entailing an increase in circuit area and an increase in design cost.

The present invention has been achieved in order to solve the problems mentioned above, and an object of the present invention is to provide a normally operable decoder circuit without entailing a delay in decoding operation, an increase in circuit area, and an increase in circuit design cost.

An embodiment of the present invention has a load current generating portion which supplies a load current to a potential setting node to impart a high voltage thereto. The load current generating portion supplies the load current to the potential setting node via two PMOS transistors coupled in series. An output signal is outputted by an inverter which receives a signal obtained from the potential setting node as an input signal. The output signal defines selection/non-selection of an object to be controlled, such as a word line in a semiconductor memory device or the like.

According to the embodiment, the load current generating portion supplies the load current to the potential setting node via the two PMOS transistors coupled in series, thereby imparting the high voltage thereto. Therefore, even when the high potential is set to a value of not less than the ON-state breakdown voltage of each of the two PMOS transistors mentioned above, it is possible to set the source-drain voltage of each of the two PMOS transistors mentioned above to a value of not more than the ON-state breakdown voltage.

As a result, it becomes possible to set the high voltage to a value of not less than the ON-state breakdown voltage of each of the PMOS transistors without entailing degraded reliability.

BRIEF DESCRIPTION OF THE DRAWINGS

FIG. 8 is an illustrative view showing an operation state of the row decoder shown in FIGS. 5 and 6, and a main operation state of the flash memory in a tabular form;

FIG. 9 is an illustrative view showing the definition of the voltages used in the first application example in a tabular form;

FIG. 10 is an illustrative view showing the settings of various power supply voltages and control signals in a read operation, a write operation, and an erase operation in the first application example in a tabular form;

FIG. 11 is an illustrative view schematically showing a layout configuration for implementing the circuit of the first application example;

FIGS. 12A and 12B are illustrative views each showing an actual layout configuration corresponding to four word lines in the word-line-driving-inverter formation region shown in FIG. 11 and the like;

FIG. 16 is an illustrative view showing the settings of various power supply voltages and control signals in a read operation, a write operation, and an erase operation in the second application example in a tabular form;

DESCRIPTION OF THE PREFERRED EMBODIMENTS

Embodiment 1

Figure 1:
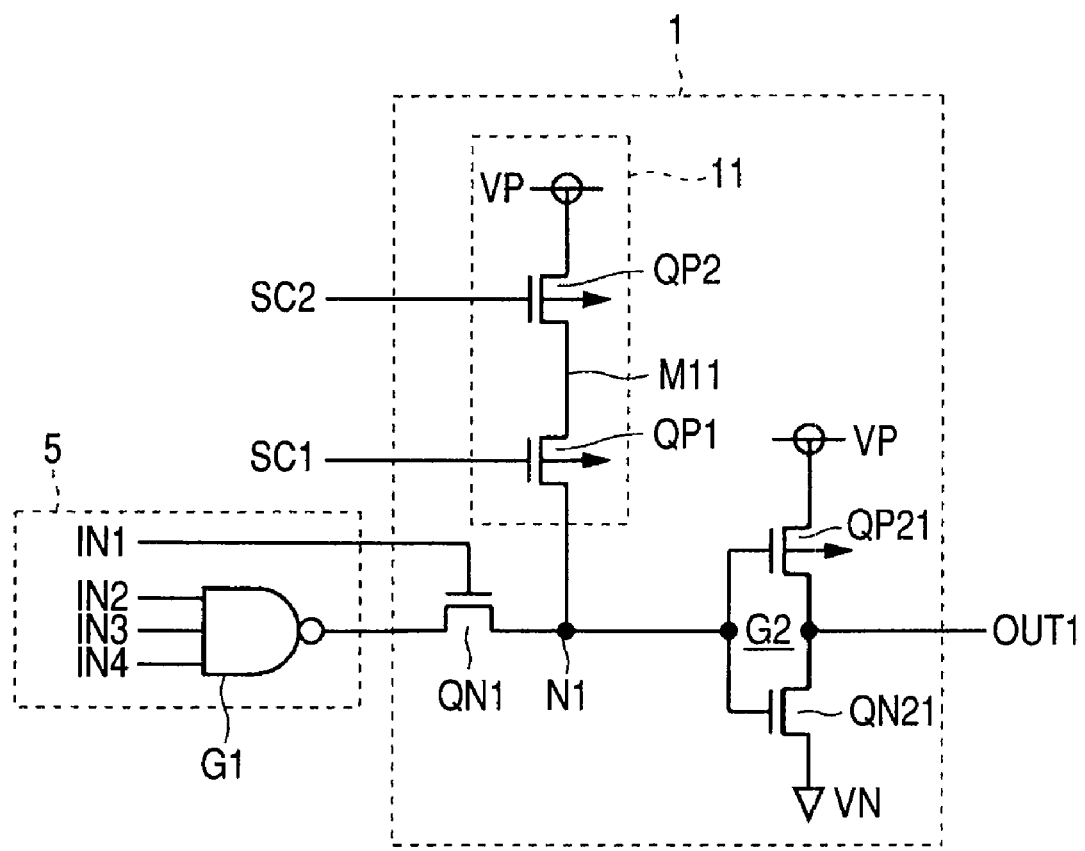
FIG. 1 is a circuit diagram showing a structure of a part of a decoder circuit as a first embodiment of the present invention.

FIG. 1 is a circuit diagram showing a structure of a part of a decoder circuit as a first embodiment of the present invention which is adopted in a semiconductor memory device such as a flash memory.

As shown in the drawing, the decoder circuit of the first embodiment is comprised of a high-voltage circuit portion 1 and a low-voltage circuit portion (low-voltage setting portion) 5. The low-voltage circuit portion 5 performs a low-voltage operation using a low power supply voltage VD of about 1.5 V and a GND voltage VS of about 0 V as a "H" level and a "L" level, respectively. The high-voltage circuit portion 1 performs a high voltage operation using a high power supply voltage VP of about 5 to 10 V and a negative-side power supply voltage VN of 0 V to a value around a negative high voltage as the "H" level and the "L" level, respectively.

The low-voltage circuit portion 5 is comprised of a 3-input NAND gate G1, receives input signals IN2 to IN4, and outputs the output signal thereof to the high-voltage circuit portion 1. An input signal IN1 is directly outputted to the high-voltage circuit portion 1 without any alteration.

The high-voltage circuit portion 1 is comprised of a load current generating portion 11 (high voltage imparting portion), an NMOS transistor QN1, and an inverter G2 (output signal driving portion). In the NMOS transistor QN1, one electrode receives the output of the NAND gate G1, the other electrode is coupled to a node N1 (potential setting node) and a gate electrode receives the input signal IN1.

The load current generating portion 11 is comprised of PMOS transistors QP1 and QP2 (first and second switching elements) which are coupled in series. In the PMOS transistor QP2, one electrode receives the high power supply voltage VP, a gate electrode receives a (load current) control signal SC2, and the other electrode serves as an intermediate node M11. In the PMOS transistor QP1, one electrode is coupled to the other electrode (intermediate node M11) of the PMOS transistor QP2, a gate electrode receives a (load current) control signal SC1, and the other electrode is coupled to the node N1, i.e., the other electrode of the NMOS transistor QP1. In principle, the control signals SC1 and SC2 are each set to a voltage (such as the GND voltage VS or the low power supply voltage VD) at which the PMOS transistors QP1 and QP2 are each in a normally-ON state.

However, the decoder circuit is designed to satisfy the foregoing first operation condition under which, when the output of the NAND gate G1 is on the "L" level (GND voltage VS), the ("L"-level) driving forces of the NAND gate G1 and the NMOS transistor QN1 exceed the driving forces of the PMOS transistors QP1 and QP2 to forcibly set the node N1 to the GND voltage VS. For example, by setting the gate width of each of MOS transistors (particularly the MOS transistor for setting the GND voltage VS) configuring the NAND gate G1 and the NMOS transistor QN1 to a value larger than that of the PMOS transistor QP1 or the like, a structure which satisfies the foregoing first operation condition mentioned above is implemented.

Therefore, when the input signals IN1 to IN4 are all on the "H" level, the low-voltage circuit portion 5 and the NMOS transistor QN1 determine a selected state so that the output of the NAND gate G1 becomes "L", and the NMOS transistor QN1 is turned ON. As a result, the NAND gate G1 in the low-voltage circuit portion 5 and the NMOS transistor QN1 satisfy the foregoing first operation condition to allow the node N1 to be forcibly set to the GND voltage VS during the selected state.

The inverter G2 is implemented by a CMOS structure comprised of a PMOS transistor QP21 and an NMOS transistor QN21 which are coupled in series to share a gate electrode. That is, the one electrode of the PMOS transistor QP21 receives the high power supply voltage VP, the one electrode of the NMOS transistor QN21 receives the negative-side power supply voltage VN, and the shared gate electrode of both of the PMOS transistor QP21 and the NMOS transistor QN21 is coupled to the node N1. A signal obtained from the other electrode of the PMOS transistor QP21 (NMOS transistor QN21) is outputted as an output signal OUT1.

The inverter G2 thus structured receives a signal obtained from the node N1 as an input signal, and outputs an inversion signal thereof as the output signal OUT1. The output signal OUT1 drives the word line corresponding thereto or the like. That is, the voltage level of the output signal OUT1 defines selection/non-selection of an object to be controlled, such as the word line in the semiconductor memory device.

A description will be given of a decoding operation of the decoder circuit according to the first embodiment in such a structure.

During a non-selected state, at least one of the input signals IN1 to IN4 which are predecode signals is on the "L" level, and the output of the NAND gate G1 is on the "H" level, or the NMOS transistor QN1 is in an OFF state so that there is no extraction of the potential of the node N1 to the "L" level. Accordingly, the potential of the node N1 is set to the high power supply voltage VP by a charging operation by the PMOS transistors QP1 and QP2 each in the normally-ON state.

As a result, the "L" level (negative-side power supply voltage VN) is outputted as the output signal OUT1 from the inverter G2 to bring an object to be controlled, such as the word line which receives the output signal OUT1 or the like, into the non-selected state.

On the other hand, during a selected state, the input signals IN1 to IN4 are all on the "H" level, the output of the NAND gate G1 is set to the "L" level, and the NMOS transistor QN1 is in the ON state to satisfy the foregoing first operation condition. Accordingly, the potential of the node N1 is extracted to the "L" level (GND voltage VS).

As a result, the "H" level (high power supply voltage VP) is outputted as the output signal OUT1 from the inverter G2 to bring an object to be controlled, such as the word line which receives the output signal OUT1 or the like, into the selected state.

Such a decoder circuit according to the first embodiment implements the load current generating portion 11 with the series coupling between the PMOS transistors QP1 and QP2. Accordingly, when the potential of the node N1 is set to the "L" level during the selected state, the high power supply voltage VP is divided by the PMOS transistors QP1 and QP2 coupled in series so that the potential of the intermediate node M11 becomes the intermediate potential VM11 between the high power supply voltage VP and the GND voltage VS. That is, the respective source-drain voltages Vds1 and Vds2 of the PMOS transistors QP1 and QP2 become (VP−VM11) and VM11.

As a result, even when a high voltage exceeding the ON-state breakdown voltage of each of the PMOS transistors QP1 and QP2 is imparted as the high power supply voltage VP, there is no degradation of the reliability of the decoder circuit according to the first embodiment, and a normal operation can be performed as long as the source-drain voltages Vds1 and Vds2 can be each reduced to a value of not more than the ON-state breakdown voltage.

Additionally, by setting the voltage level of each of the control signals SC1 and SC2 to an optimum value (e.g., the low power supply voltage VD or the like) in compliance with the high power supply voltage VP, it is possible to suppress a load current, and achieve lower power consumption. As a result, the effect of allowing the size of the NMOS transistor (the NAND gate G1, the NMOS transistor QN1) for satisfying the foregoing first operation condition for the extraction of the load current to be reduced to the minimum necessary, and also allowing a reduction in layout area is achieved.

Figure 19:
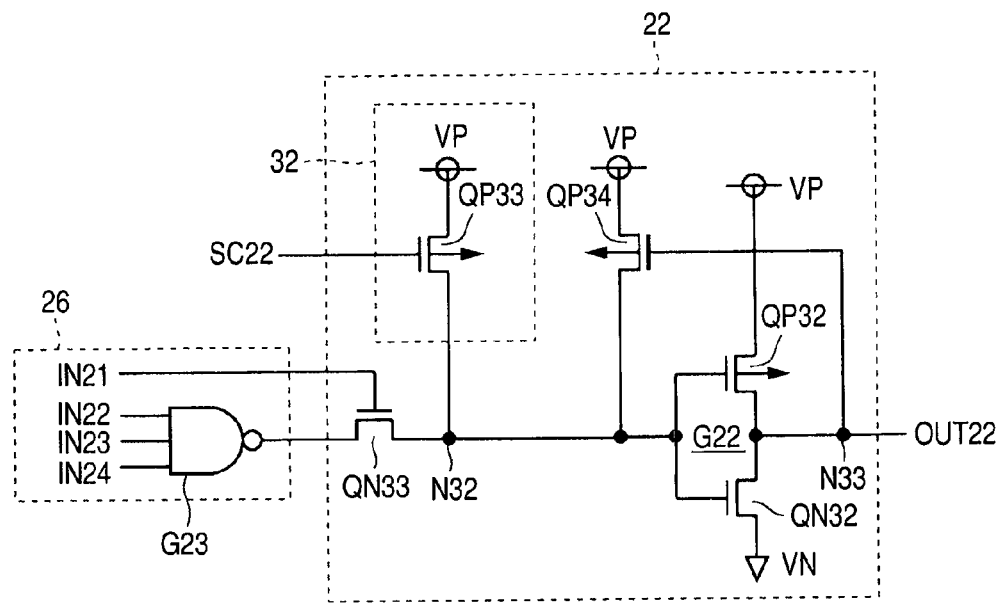
FIG. 19 is a circuit diagram showing a structure of a part of a decoder circuit as a second conventional circuit.
Figure 20:
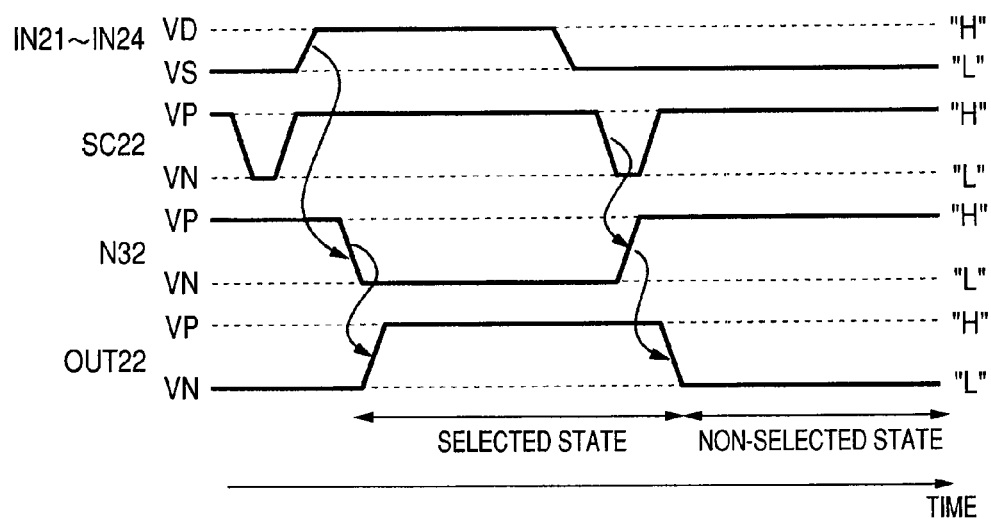
FIG. 20 is a waveform diagram showing an operation of the second conventional circuit.

Moreover, since the half latch circuit (corresponding to the PMOS transistor QP32) for the output signal OUT1 on the "L" level is unnecessary, unlike in the second conventional circuit shown in FIG. 19, it is possible to form a layout in accordance with the pitch of the word lines even when the decoder circuit according to the first embodiment is adopted in the final stage (e.g., word line driver) of a row decoder circuit. Further, there is no increase in design cost resulting from the provision of the half latch circuit mentioned above.

Therefore, the first decoder circuit according to the first embodiment does not entail either an increase in circuit area or an increase in design cost.

Embodiment 2

Figure 2:
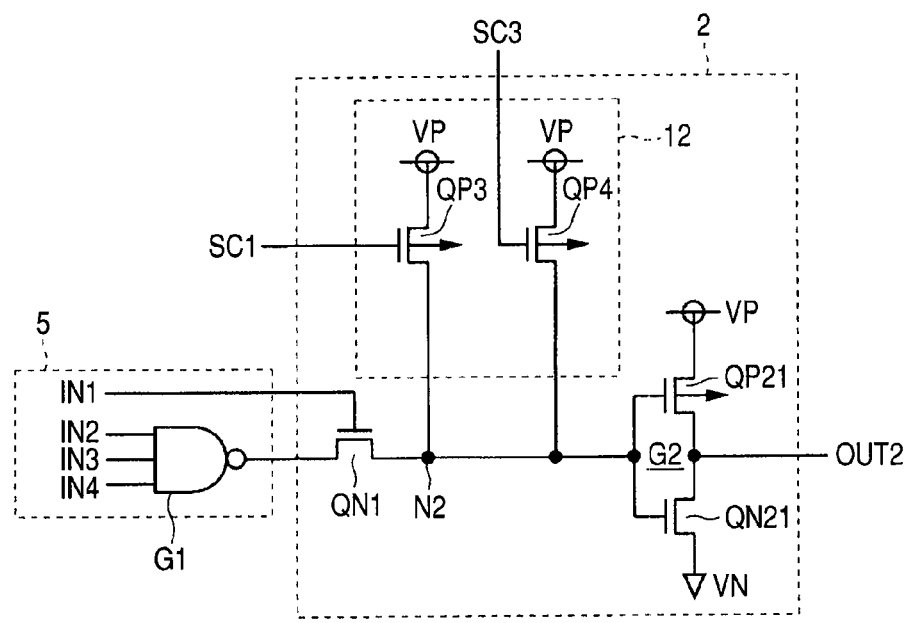
FIG. 2 is a circuit diagram showing a structure of a part of a decoder circuit as a second embodiment of the present invention.

FIG. 2 is a circuit diagram showing a structure of a part of a decoder circuit as a second embodiment of the present invention which is adopted in a semiconductor memory device or the like. As for the same parts as those of the first embodiment shown in FIG. 1, the description thereof will be omitted appropriately by providing the same reference numerals.

As shown in the drawing, the decoder circuit according to the second embodiment is comprised of a high-voltage circuit portion 2 and the low-voltage circuit portion 5. The high-voltage circuit portion 2 performs a high-voltage operation, similarly to the high-voltage circuit portion 1.

The high-voltage circuit portion 2 is comprised of a load current generating portion 12 (high voltage imparting portion), an NMOS transistor QN1, and an inverter G2. In the NMOS transistor QN1, one electrode receives the output of the NAND gate G1, the other electrode is coupled to a node N2 (potential setting node), and a gate electrode receives the input signal IN1.

The load current generating portion 12 is comprised of PMOS transistors QP3 and QP4 (first and second switching elements) provided independently of each other. In the PMOS transistor QP3, one electrode receives the high power supply voltage VP, a gate electrode receives the control signal SC1, and the other electrode is coupled to the node N2, i.e., the other electrode of the NMOS transistor QN1. In principle, the control signal SC1 is set to a voltage (such as the GND voltage VS or the low power supply voltage VD) at which the PMOS transistor QP3 is in the normally-ON state.

In the PMOS transistor QP4 provided independently of the PMOS transistor QP3, one electrode receives the high power supply voltage VP, a gate electrode receives a (load current) control signal SC3, and the other electrode is coupled to the node N2. As will be described later, the control signal SC3 is triggered by the setting of the non-selected state by the input signals IN1 to IN4 to be set to the "L" level (negative-side power supply voltage VN) only during an initial predetermined period after the setting of the non-selected state, while it is set to the "H" level (high power supply voltage VP) during the other period.

The decoder circuit according to the second embodiment is designed to satisfy the foregoing first operation condition under which, when the output of the NAND gate G1 is on the "L" level (GND voltage VS), the ("L"-level) driving forces of the NAND gate G1 and the NMOS transistor QN1 exceed the driving force of the PMOS transistor QP3 to forcibly set the node N2 to the GND voltage VS, in the same manner as in the first embodiment.

The inverter G2 receives a signal obtained from the node N2 as an input signal, and outputs the inversion signal thereof as the output signal OUT2. The output signal OUT2 drives the word line corresponding thereto or the like.

Figure 3:
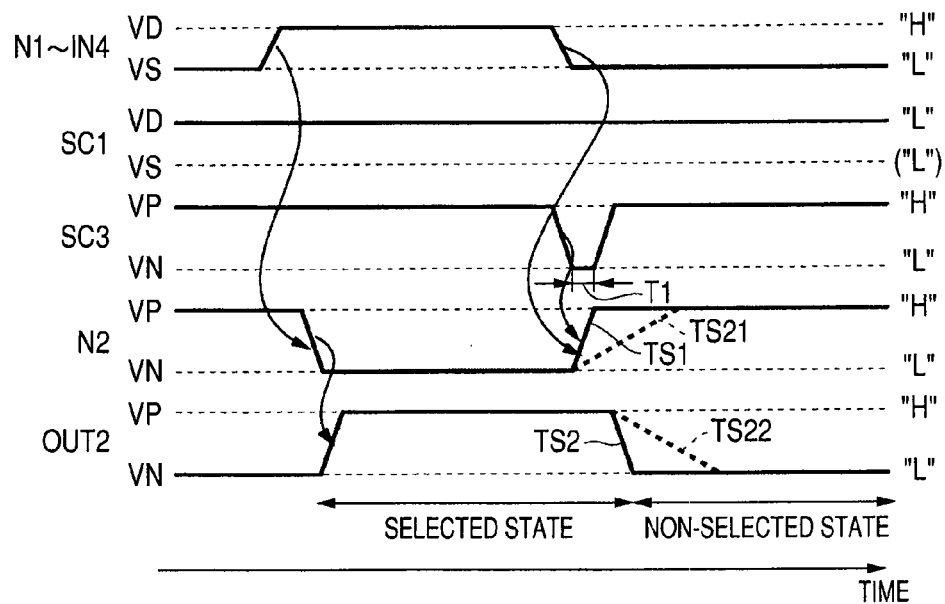
FIG. 3 is a waveform diagram showing an operation of the decoder circuit according to the second embodiment.

FIG. 3 is a waveform diagram showing an operation of the decoder circuit according to the second embodiment. Referring to the drawing, the decoding operation in the second embodiment will be described hereinbelow.

During the non-selected state, at least one of the input signals IN1 to IN4 which are predecode signals is on the "L" level, and the output of the NAND gate G1 is on the "H" level, or the NMOS transistor QN1 is in the OFF state so that there is no extraction of the potential of the node N2 to the "L" level. Accordingly, the potential of the node N2 is set to the high power supply voltage VP by a charging operation by the PMOS transistor QP3 in the normally-ON state.

At this time, in the initial predetermined period T1 of the non-selected state, the control signal SC3 becomes "L", the PMOS transistor QP3 is turned ON so that, during the predetermined period T1 mentioned above, the node N2 is charged by both of the PMOS transistors QP3 and QP4 each in the ON state.

As a result, during a transition from the selected state (N2="L", OUT2="H") to the non-selected state (N2="H", OUT2="L"), the node N2 rapidly rises toward the high power supply voltage VP, as in the transition TS1 of FIG. 3. A transition TS21 (broken-line portion) virtually shows a potential change at the node N2 when the PMOS transistor QP3 is in the OFF state.

As a result, as shown in the transition TS2 of FIG. 3, the output signal OUT2 rapidly falls, the "L" level (negative-side power supply voltage VN) is outputted as the output signal OUT2 from the inverter F2 to bring the word line which receives the output signal OUT2 or the like into the non-selected state. A transition TS22 (broken-line portion) virtually shows a potential change in the output signal OUT2 when the PMOS transistor QP3 is in the OFF state.

On the other hand, during the selected state, the input signals IN1 to IN4 are all on the "H" level, the output of the NAND gate G1 is set to the "L" level, and the NMOS transistor QN1 is in the ON state to satisfy the foregoing first operation condition. Accordingly, the potential of the node N2 is extracted to the "L" level (GND voltage VS).

As a result, the "H" level (high power supply voltage VP) is outputted as the output signal OUT2 from the inverter G2 to bring the word line which receives the output signal OUT2 or the like into the selected state.

In such a decoder circuit according to the second embodiment, by setting the voltage level of the control signal SC1 to an optimum value (e.g., the low power supply voltage VD or the like) in compliance with the high power supply voltage VP, it is possible to suppress the load current, and achieve lower power consumption. As a result, the effect of allowing the size of the NMOS transistor (the NAND gate G1, the NMOS transistor QN1) for the extraction of the load current to be reduced to the minimum necessary, and also allowing a reduction in layout area is achieved.

Further, since the decoder circuit according to the second embodiment does not need the half latch circuit for the output signal OUT2 in the same manner as in the first embodiment, the decoder circuit according to the second embodiment does not entail either an increase in circuit area or an increase in design cost.

Additionally, during the initial predetermined period after the initiation of the non-selected state, the load current generating portion 12 allows not only the PMOS transistor QP3, but also the PMOS transistor QP4 to charge the node N2 with the high power supply voltage VP.

Therefore, the ability of the load current generating portion 12 to drive the node N2 can be sufficiently enhanced during the transition from the selected state to the non-selected state so that no delay occurs in the decoding operation. In addition, by setting the high power supply voltage VP to a value of not more than the ON-state breakdown voltage of each of the PMOS transistors QP3 and QP4, a normal operation can be performed.

Embodiment 3

Figure 4:
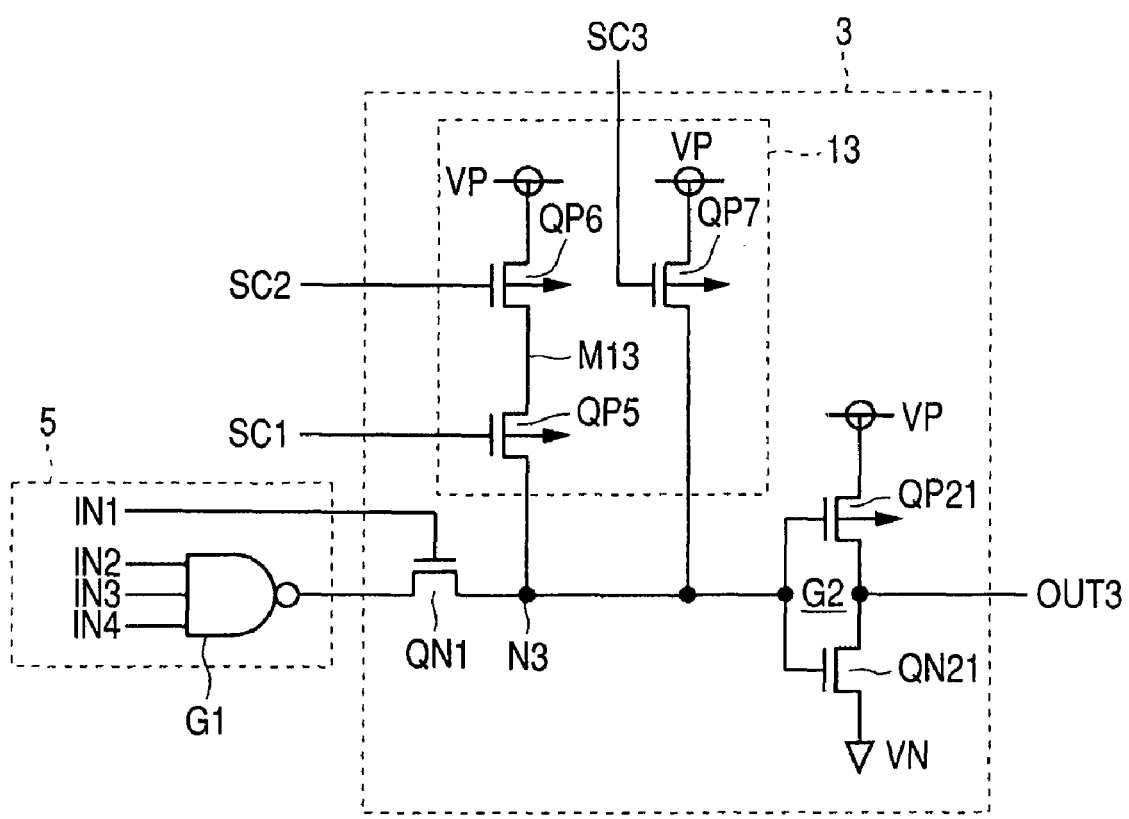
FIG. 4 is a circuit diagram showing a structure of a part of a decoder circuit as a third embodiment of the present invention.

FIG. 4 is a circuit diagram showing a structure of a part of a decoder circuit as a third embodiment of the present invention which is adopted in a semiconductor memory device or the like. As for the same parts as those of the first embodiment shown in FIG. 1 or the second embodiment shown in FIG. 2, the description thereof will be omitted appropriately by providing the same reference numerals.

As shown in the drawing, the decoder circuit according to the third embodiment is comprised of a high-voltage circuit portion 3 and the low-voltage circuit portion 5. The high-voltage circuit portion 3 performs a high-voltage operation, similarly to the high-voltage circuit portion 1 and the high-voltage circuit portion 2.

The high-voltage circuit portion 3 is comprised of a load current generating portion 13 (high voltage imparting portion), the NMOS transistor QN1, and the inverter G2. In the NMOS transistor QN1, one electrode receives the output of the NAND gate G1, the other electrode is coupled to the node N2, and a gate electrode receives the input signal IN1.

The load current generating portion 13 is comprised of PMOS transistors QP5 to QP7 (first to third switching elements). In the PMOS transistor QP6, one electrode receives the high power supply voltage VP, a gate electrode receives the control signal SC2, and the other electrode serves as an intermediate node M13. In the PMOS transistor QP5, one electrode is coupled to the other electrode (intermediate node M13) of the PMOS transistor QP6, a gate electrode receives the control signal SC1, and the other electrode is coupled to a node N3 (potential setting node), i.e., the other electrode of the NMOS transistor QN1. In principle, the control signals SC1 and SC2 are each set to a voltage (such as the GND voltage VS or the low power supply voltage VD) at which the PMOS transistors QP5 and QP6 are each in the normally "ON" state.

In the PMOS transistor QP7 provided independently of the PMOS transistors QP5 and QP6, one electrode receives the high power supply voltage VP, a gate electrode receives the control signal SC3, and the other electrode is coupled to the node N3. In the same manner as in the second embodiment, the control signal SC3 is triggered by the setting of the non-selected state by the input signals IN1 to IN4 to be set to the "L" level only during an initial predetermined period after the setting of the non-selected state, while it is set to the "H" level during the other period.

It is to be noted that the voltage level of the high power supply voltage VP may exceed the ON-state breakdown voltage of the PMOS transistor QP7. However, since the "H" level (high power supply voltage VP) is imparted to the gate electrode of the PMOS transistor QP7 to keep the PMOS transistor QP7 in the OFF state during the selected state, there is no degradation of the reliability of the decoder circuit according to the third embodiment.

The decoder circuit according to the third embodiment is designed to satisfy the foregoing first operation condition under which, when the output of the NAND gate G1 is on the "L" level (GND voltage VS), the ("L"-level) driving forces of the NAND gate G1 and the NMOS transistor QN1 exceed the driving force of the PMOS transistor QP3 to set the node N2 to the GND voltage, in the same manner as in the first embodiment.

The inverter G2 receives a signal obtained from the node N3 as an input signal, and outputs the inversion signal thereof as an output signal OUT3. The output signal OUT3 drives the word line corresponding thereto or the like.

A description will be given of a decoding operation of the decoder circuit according to the third embodiment in such a structure.

During the non-selected state, at least one of the input signals IN1 to IN4 which are predecode signals is on the "L" level, and the output of the NAND gate G1 is on the "H" level, or the NMOS transistor QN1 is in the OFF state so that there is no extraction of the potential of the node N3 to the "L" level. Accordingly, the potential of the node N3 is set to the high power supply voltage VP by charging operations by the PMOS transistors QP5 and QP6 each in the normally-ON state.

At this time, in the initial predetermined period of the duration of the non-selected state, the control signal SC3 becomes "L", the PMOS transistor QP5 is turned ON so that, during the initial predetermined period mentioned above, the node N3 is charged not only by the PMOS transistors QP5 and QP6 each in the ON state, but also by the PMOS transistor QP7 in the ON state. As a result, the node N3 rapidly rises toward the "H" level (high power supply voltage VP).

As a result, the output signal OUT2 from the inverter G2 rapidly shifts from the "H" level to the "L" level (negative-side power supply voltage VN) to bring the corresponding word line which receives the output signal OUT2 on the "L" level or the like into the non-selected state.

On the other hand, during the selected state, the input signals IN21 to IN24 are all on the "H" level, the output of the NAND gate G1 is set to the "L" level, and the NMOS transistor QN11 is in the ON state to satisfy the foregoing first operation condition. Accordingly, the potential of the node N3 is extracted to the "L" level (GND voltage VS).

As a result, the "H" level (high power supply voltage VP) is outputted as the output signal OUT3 from the inverter G2 to bring the corresponding word line which receives the output signal OUT3 or the like into the selected state.

Such a decoder circuit according to the third embodiment implements a part the of load current generating portion 13 with the series coupling between the PMOS transistors QP5 and QP6. Accordingly, when the potential of the node N3 is set to the "L" level during the selected state, the potential of the intermediate node M13 becomes the intermediate potential VM13 between the high power supply voltage VP and the GND voltage VS. The respective source-drain voltages Vds6 and Vds7 of the PMOS transistors QP5 and QP6 become (VP−VM13) and VM13, respectively.

As a result, even when a high voltage exceeding the ON-state breakdown voltage of each of the PMOS transistors QP5 and QP6 is imparted as the high power supply voltage VP, there is no degradation of the reliability of the decoder circuit according to the third embodiment as long as the source-drain voltages Vds5 and Vds6 can be each reduced to a value of not more than the ON-state breakdown voltage, in the same manner as in the first embodiment.

Additionally, by setting the voltage level of each of the control signals SC1 and SC2 to an optimum value (e.g., the low power supply voltage VD or the like) in compliance with the high power supply voltage VP, it is possible to suppress the load current, and achieve lower power consumption. Further, the effect of allowing the size of the NMOS transistor (the NAND gate G1, the NMOS transistor QN1) for the extraction of the load current to be reduced to the minimum necessary, and also allowing a reduction in layout area is achieved.

Further, since the decoder circuit according to the third embodiment does not need the half latch circuit for feedbacking the output signal OUT3 in the same manner as in the first and second embodiments, the decoder circuit according to the third embodiment does not entail either an increase in circuit area or an increase in design cost.

Additionally, in the decoder circuit according to the third embodiment, the high power supply voltage VP is imparted to the node N3 not only by the PMOS transistors QP5 and QP6, but also by the PMOS transistor QP7 in the initial predetermined period of the duration of the non-selected state.

As a result, the driving ability of the high power supply voltage VP of the load current generating portion 13 during the transition from the selected state to the non-selected state can be further enhanced, and hence the decoding operation can be performed at a higher speed.

Application Example 1

Figure 5:
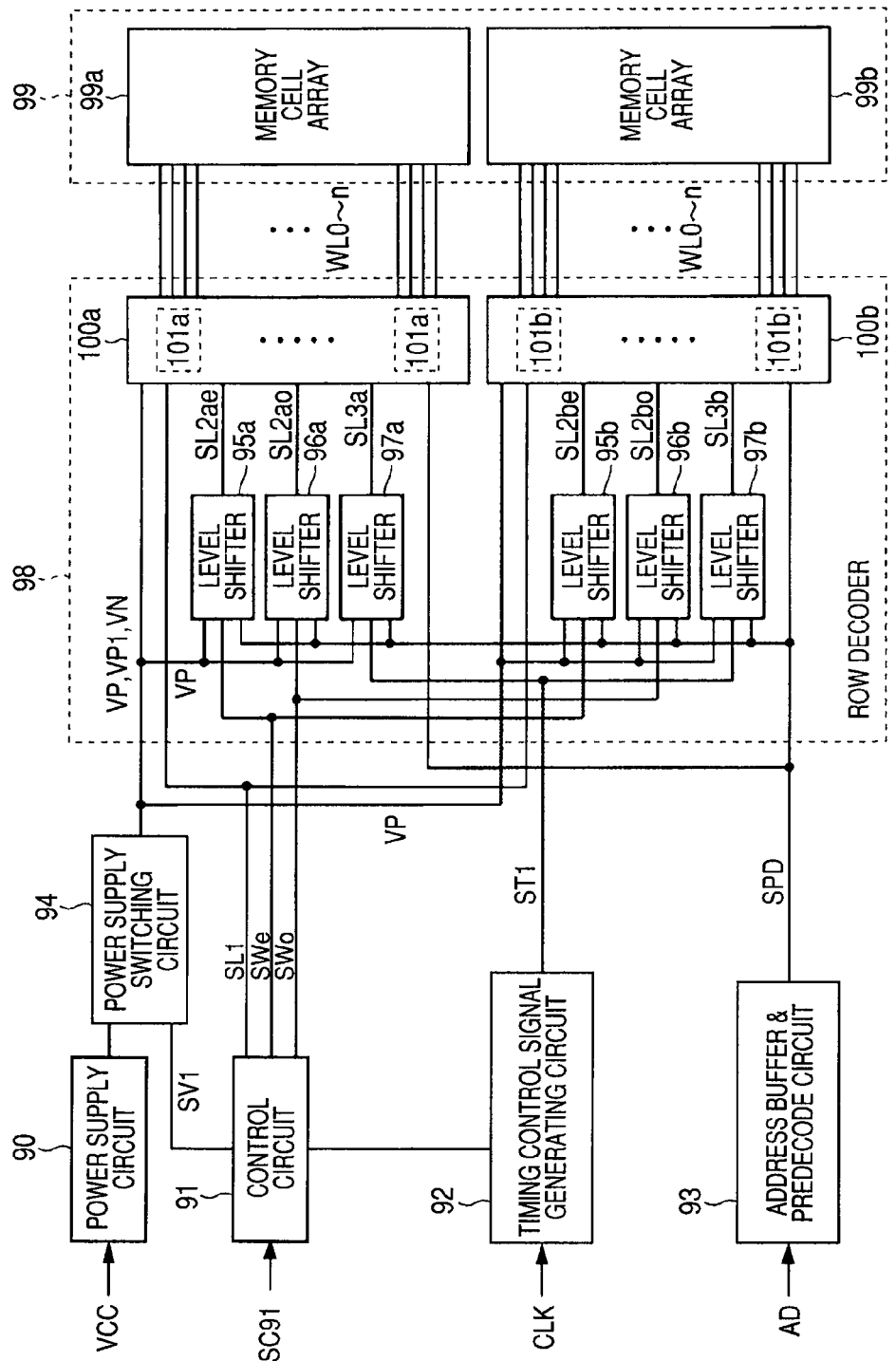
FIG. 5 is a block diagram showing the portion of a flash memory as a first application example using the decoder circuit according to the third embodiment which is related to a row decoder portion.

FIG. 5 is a block diagram showing the portion of a flash memory as a first application example using the decoder circuit according to the third embodiment which is related to a row decoder portion. That is, FIG. 5 shows a circuit configuration including input signals such as an address signal AD and a control signal SC91, a row decoder 98, a memory array set 99, and the circuits interposed between the input signals and the row decoder 98.

Figure 6:
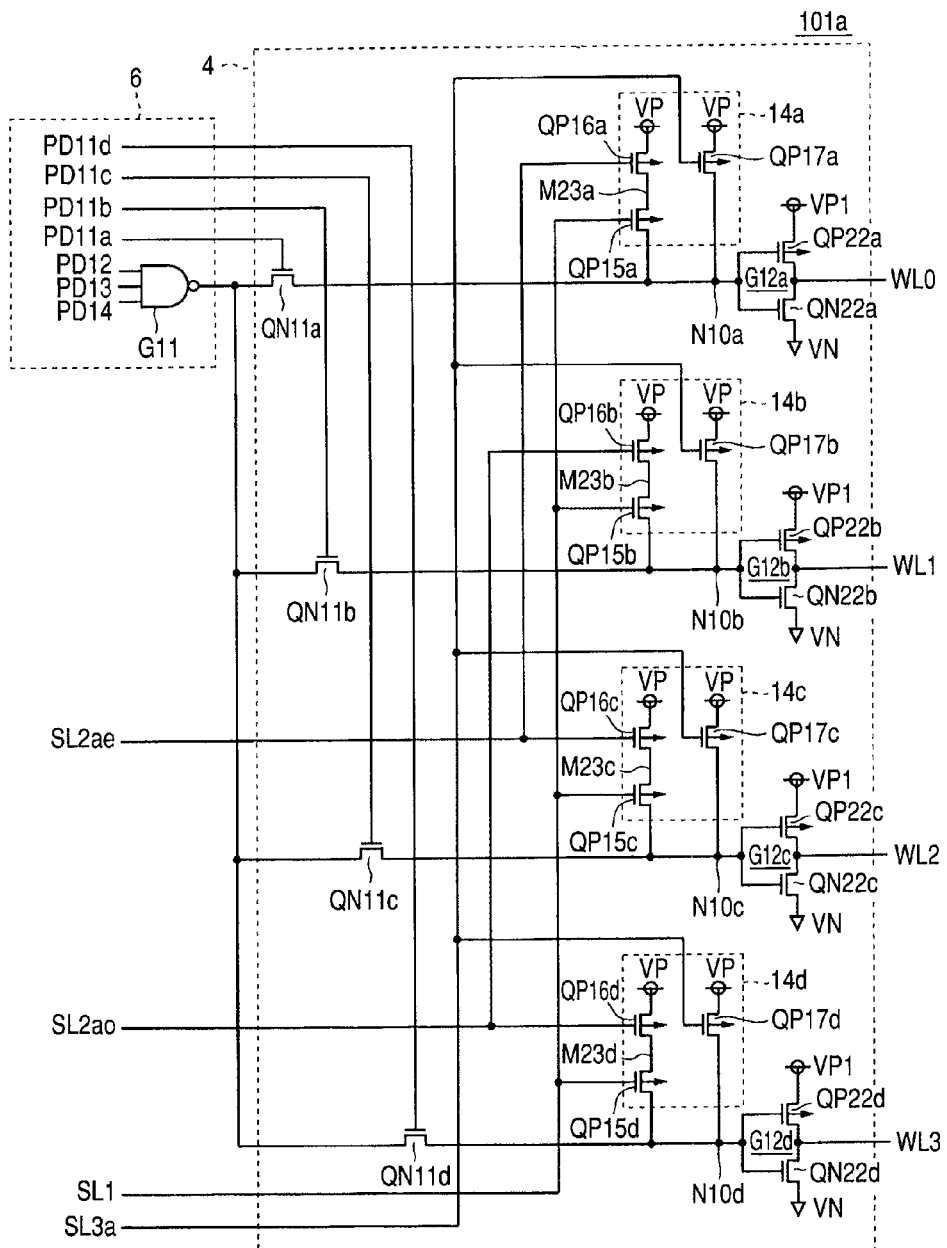
FIG. 6 is a circuit diagram showing a part of FIG. 5 in detail.

FIG. 6 is a circuit diagram showing a part (corresponding to the word lines WL0 to WL3 of a memory array 99a) of FIG. 5 in detail. That is, FIG. 6 is a circuit diagram showing a partial word line driving circuit 101a corresponding to the fourth word lines WL0 to WL3.

In such a structure as shown in FIGS. 5 and 6, the decoder circuit according to the third embodiment is adopted in the final stage of the row decoder of the flash memory in correspondence to a single word line WL.

As depicted in FIG. 5, as the row decoder 98, a structure which controls two memory array blocks (memory arrays 99a and 99b) configuring the memory array set 99 as an object to be controlled is shown. The decoder corresponding to the memory arrays 99a and 99b is constructed by disposing the partial word line driving circuits 101a (101b) shown in FIG. 6 such that the number thereof corresponds to the number of the word lines WL.

In FIG. 5, various voltage levels for high power supply voltages VP and VP1 to be inputted to the row decoder 98 are generated in a power supply circuit 90. A control circuit 91 outputs a power supply select signal SV1, a load current control signal SL1, an even-numbered-address word line select signal SWe, and an odd-numbered-address word line select signal SWo to the row decoder 98 based on the control signal SC91.

As will be described later in detail, for the high-voltage portion of each of inverters G12a to G12d, a voltage different from that for the other portions may be set. Therefore, for distinction from the other power supply voltage VP, the voltage set for the high-voltage portion of each of the inverters G12a to G12d is designated as the high power supply voltage VP1.

A power supply switching circuit 94 supplies the high power supply voltages VP, VP1, and VN to the row decoder 98, while switching each of the voltages between a plurality of voltage levels based on the power supply select signal SV1 from the control circuit 91. Besides the high power supply voltages VP and VP1, there is a negative-side power supply voltage VN or the like.

A timing control signal generating circuit 92 generates a timing control signal ST1 based on a clock CLK, and outputs the generated timing control signal ST1 to the row decoder 98.

An (address buffer &) predecode circuit 93 outputs a predecode signal SPD obtained by buffering and predecoding the address signal AD to the row decoder 98.

The row decoder 98 is comprised of level shifters 95a to 97a, a word line driving circuit 100a, level shifters 95b to 97b, and a word line driving circuit 100b.

The level shifter 95a receives the high power supply voltage VP, and outputs a load current control signal SL2ae which has been level-shifted to the high power supply voltage VP based on the even-numbered-address word line select signal SWe and the predecode signal SPD.

The level shifter 96a receives the high power supply voltage VP, and outputs a load current control signal SL2ao which has been level-shifted to the high power supply voltage VP based on the odd-numbered-address word line select signal SWo and the predecode signal SPD.

The level shifter 97a receives the high power supply voltage VP, and outputs a load current control signal SL3a which has been level-shifted to the high power supply voltage VP based on the timing control signal ST1 and the predecode signal SPD.

The word line driving circuit 100a receives the high power supply voltages VP, VP1, and VN, and drives the one of the word lines WL0 to WLn of the memory array 99a which is in the selected state based on the load current control signal SL2ae, the load current control signal SL2ao, the load current control signal SL3a, and the predecode signal SPD.

Since the level shifters 95b to 97b and the word line driving circuit 100b have structures equivalent to those of the level shifters 95a to 97a and the word line drive circuit 100a, they perform the same operations as performed by the level shifters 95a to 97a and the word line driving circuit 100a described above.

That is, a load current control signal SL2be, a load current control signal SL2bo, and a load current control signal SL3b are obtained from the level shifters 95b, 96b, and 97b and, based on these signals, the one of the word lines WL0 to WLn of the memory array 99b which is in the selected state is driven by the word line driving circuit 100b.

As shown in FIG. 6, the partial word line driving circuit 101a corresponding to the word lines WL0 to WL3 is comprised of a high-voltage circuit portion 4 and a low-voltage circuit portion 6. The high-voltage circuit portion 4 performs a high-voltage operation, similarly to the high-voltage circuit portion 3 according to the third embodiment. The low-voltage circuit portion 6 performs a low-voltage operation, similarly to the low-voltage circuit portion 5 according to the third embodiment.

The low-voltage circuit portion 6 is comprised of a 3-input NAND gate G11, receives predecode signals PD12 to PD14, and outputs the output signal thereof to the high-voltage circuit portion 4. Predecode signals PD11a to PD11d are directly outputted to the high-voltage circuit portion 4 without any alteration. The predecode signals PD11a to PD11d and the predecode signals PD12 to PD14 each mentioned above correspond to a part of the predecode signal SPD shown in FIG. 5.

The high-voltage circuit portion 4 is comprised of load current generating portions 14a to 14d, NMOS transistors QN11a to QN11d, and the inverters G12a to G12d. The load current generating portions 14a to 14d, the NMOS transistors QN11a to QN11d, and the inverters G12a to G12d are provided correspondingly to the word lines WL0 to WL3.

Hereinbelow, a description will be given primarily of the load current generating portion 14a, the NMOS transistor QN11a, and the inverter G12a provided correspondingly to the word line WL0.

In the NMOS transistors QN11a to QN11d, the other electrodes commonly receive the output of the NAND gate G11, one electrodes are respectively coupled to nodes N10a to N10d (potential setting nodes), and gate electrodes respectively receive the predecode signals PD11a to PD11d.

The load current generating portion 14a is comprised of PMOS transistors QP15a to QP17a. In the PMOS transistor QP16a, one electrode receives the high power supply voltage, a gate electrode receives the load current control signal SL2ae, and the other electrode serves as an intermediate node M23a.

In the PMOS transistor QP15a, one electrode is coupled to the other electrode (intermediate node M23a) of the PMOS transistor QP16a, a gate electrode receives the load current control signal SL1, and the other electrode is coupled to the node 10a, i.e., the other electrode of the NMOS transistor QN11a.

In the PMOS transistor QP17a, one electrode receives the high power supply voltage VP, a gate electrode receives the load current control signal SL3a, and the other electrode is coupled to the node N10a.

The inverter G12a is implemented by a CMOS structure comprised of a PMOS transistor QP22a and an NMOS transistor QN22a which are coupled in series to share a gate electrode. That is, the one electrode of the PMOS transistor QP22a receives the high power supply voltage VP1, the one electrode of the NMOS transistor QN22a receives the negative-side power supply voltage VN, and the shared gate electrode of both of the PMOS transistor QP22a and the NMOS transistor QN22a is coupled to the node N10a. A signal obtained from the other electrode of the PMOS transistor QP22a (NMOS transistor QN22a) is imparted to the word line WL0.

The correspondence relations between the decoder circuit according to the third embodiment and the load current generating portion 14a, the NMOS transistor QN11a, and the inverter G12a are as follows.

The NAND gate G11 corresponds to the NAND gate G1. The NMOS transistor QN11a corresponds to the NMOS transistor QN1. the load current generating portion 14a corresponds to the load current generating portion 13. The inverter G12a corresponds to the inverter G2.

The PMOS transistors QP15a to QP17a in the load current generating portion 14a correspond to the PMOS transistors QP5 to QP7 in the load current generating portion 14. The PMOS transistor QP22a and the NMOS transistor QN22a in the inverter G12a correspond to the PMOS transistor QP21 and the NMOS transistor QN21 in the inverter G2.

Further, the predecode signal PD11a corresponds to the input signal IN1, and the predecode signals PD12 to PD14 correspond to the input signals IN2 to IN4, while the load current control signal SL1 corresponds to the control signal SC1, the load current control signal SL2ae corresponds to the control signal SC2, and the load current control signal SL3a corresponds to the control signal SC3.

Additionally, the first application example is designed to satisfy the foregoing first operation condition under which, when the output of the NAND gate G11 is on the "L" level (GND voltage VS), the ("L"-level) driving forces of the NAND gate G11 and the NMOS transistor QN11a exceed the driving forces of the PMOS transistors QP15a and QP16a to forcibly set the node N10a to the GND voltage VS.

In what follows, the load current generating portions 14b to 14d, the NMOS transistors QN11b to QN11d, and the inverters G12b to G12d, which are provided correspondingly to the word lines WL1 to WL3, are also similarly constructed to the load current generating portion 14a, the NMOS transistor QN11a, and the inverter G12a, each provided corresponding to the word line WL0.

However, the load current generating portion 14b is comprised of PMOS transistors QP15b to QP17b, the load current generating portion 14c is comprised of PMOS transistors QP15c to QP17c, and the load current generating portion 14d is comprised of PMOS transistors QP15d to QP17d. In addition, each of nodes N10b to N10d corresponds to the node N10a.

In each of the PMOS transistors QP16b and QP16d, a gate electrode receives the load current control signal SL2ao. In the PMOS transistor QP16c, a gate electrode receives the load current control signal SL2ae.

Further, the inverter G12b is comprised of a PMOS transistor QP22b and an NMOS transistor QN22b, the inverter G12c is comprised of a PMOS transistors QP22c and an NMOS transistor QN22c, and the inverter G12d is comprised of a PMOS transistor QP22d and an NMOS transistor QN22d.

A decoding operation of the first application example thus structured will be described correspondingly to various operations of the flash memory.

In a typical flash memory, each of a read operation, a write operation, and an erase operation is possible. Each of the write operation and the erase operation can be further subdivided into several operation states. The write operation indicates injecting electrons into the floating gate of a memory transistor configuring the flash memory to increase the threshold voltage thereof, and the erase operation indicates a process reverse to the process of the write operation.

Figure 7A:
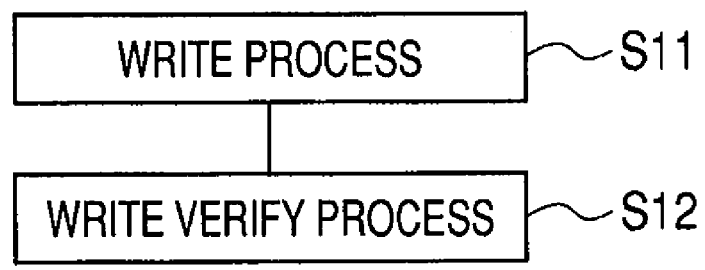
FIGS. 7A and 7B are flow charts respectively showing a write operation and an erase operation in the flash memory.
Figure 7B:
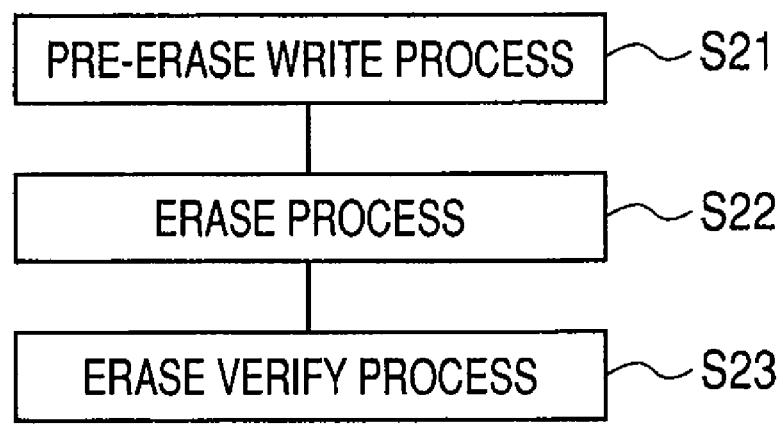

FIGS. 7A and 7B are flow charts respectively showing a write operation and an erase operation in the flash memory. As shown in FIG. 7A, the write operation is executed by sequentially performing a write process in Step S11, and a write verify process in Step S12. On the other hand, as shown in FIG. 7B, the erase operation is executed by sequentially performing a pre-erase write process in Step S21, an erase process in Step S22, and an erase verify process in Step S23.

FIG. 8 is an illustrative view showing an operation state (the voltage level of the high power supply voltage VP (VP1)) of the row decoder 98, and a main operation state (address for WL selection) of the flash memory (memory array set 99) in a tabular form.

As shown in the drawing, the selection of an address for selecting the word line WL is performed by selecting one address during each of the write process and the write verify process in the write operation, during the read operation, and during the erase verify process in the erase operation.

On the other hand, the selection of an address for selecting the word line WL is performed by separately and individually selecting even-numbered addresses and odd-numbered addresses during a test mode operation. Because the test mode operation is not directly relevant to the present invention, the description thereof will be omitted.

The selection of an address for selecting the word line WL is performed by selecting all the addresses during each of the pre-erase write process and the erase process in the erase operation.

During each of the write process, the write verify process, and the pre-erase write process, the high power supply voltage VP is set to a voltage level of not less than the ON-state breakdown voltage of each of the PMOS transistors (the PMOS transistors QP15a to QP15d and the PMOS transistors QP16a to QP16d).

During each of the read operation and the test mode operation, the high power supply voltage VP is set to a voltage level of not more than the ON-state breakdown voltage of the PMOS transistor and not less than the low power supply voltage VD.

Further, during each of the erase verify process and the erase process, the high power supply voltage VP is set to a voltage level of not more than the low power supply voltage VD.

Thus, in the row decoder of the flash memory, the voltage of the selected word line WL needs to be controlled to various voltage levels in the plural operation states.

FIG. 9 is an illustrative view showing the definition of the voltages used in the following description of operations in a tabular form. As shown in the drawing, the low power supply voltage VD indicates a voltage of about 1.5 V used as an operation power supply for the low-voltage circuit portion 6. The GND voltage VS indicates a voltage on the ground level (0 V). An over-ON-state-breakdown-voltage high voltage VH indicates a voltage level of not less than the ON-state breakdown voltage of the PMOS transistor mentioned above. A high-level intermediate voltage VM indicates a voltage level of not more than the ON-state breakdown voltage of the PMOS transistor mentioned above and not less than the low power supply voltage VD. A low-level intermediate voltage VL indicates a voltage level of not more than the low power supply voltage VD and not less than the GND voltage VS. A negative-side high voltage VNH indicates a negative voltage level (about −10 V) under the GND voltage VS. Each of the voltage levels shown in FIG. 9 is supplied by the power supply switching circuit 94 mentioned above.

FIG. 10 is an illustrative view showing the settings of various power supply voltages and control signals in the read operation, the write operation, and the erase operation in a tabular form.

As shown in the drawings, the high power supply voltage VP is set to the high-level intermediate voltage VM during the read operation, to the over-ON-state-breakdown-voltage high voltage VH during each of the write operation (the write process, the write verify process) and the pre-erase write process, and to the low-level intermediate voltage VL during each of the erase process and the erase verify process) irrespective of the selected state (a selected block) or the non-selected state (a non-selected block).

On the other hand, in the selected state, the high power supply voltage VP1 is set to the high-level intermediate voltage VM during the read operation, to the over-ON-state-breakdown-voltage high voltage VH during each of the write operation and the pre-erase write process, to the GND voltage VS during the erase process, and to the low-level intermediate voltage VL during the erase verify process. In the non-selected state, the high power supply voltage VP1 is set to the high-level intermediate voltage VM during the read operation, and to the GND voltage VS at any time other than during the read operation.

The load current control signal SL1 is set to the GND voltage VS during each of the erase process and the erase verify process, and to the low power supply voltage VD at any time other than during the erase process and the erase verify process.

In the selected state, the load current control signal SL2e (SL2ae, SL2be) is set to the low power supply voltage VD during the read operation, to the high-level intermediate voltage VM during the write operation, to the over-ON-state-breakdown-voltage high voltage VH during the pre-erase write process, to the low-level intermediate voltage VL during the erase process, and to the GND voltage VS during the erase verify process.

In the non-selected state, the load current control signal SL2e is set to the low power supply voltage VD during the read operation, to the high-level intermediate voltage VM during the write operation, and to the GND voltage VS during the erase operation.

The load current control signal SL2o (SL2ao, SL2bo) is also set in the same manner as the load current control signal SL2e.

In the selected state, the load current control signal SL3 (SL3a, SL3b) is set to the high-level intermediate voltage VM during the read operation, to the over-ON-state-breakdown-voltage high voltage VH during each of the write operation and the pre-erase write process, and to the low-level intermediate voltage VL during each of the erase process and the erase verify process.

In the non-selected state, the load current control signal SL3 generates a pulse of the GND voltage VS only during an initial predetermined period after the initiation of the read operation, and is subsequently stabilized at the high-level intermediate voltage VM. The load current control signal SL3 is set to the over-ON-state-breakdown-voltage high voltage VH during each of the write operation and the pre-erase write process, and to the low-level intermediate voltage VL during each of the erase process and the erase verify process.

In the selected state, the negative-side power supply voltage VN is set to the negative-side high voltage VNH of about −10 V only during the erase process, and to the GND voltage VS at any time other than during the erase process.

In the non-selected state, the negative-side power supply voltage VN is set to the GND voltage VS during each of the operations.

Referring to FIGS. 5 to 10, the operations of the first application example including the read operation, the write operation (the write process, the write verify process), and the erase operation (the pre-erase write process, the erase process, the erase verify process) will be described separately and individually.

(Read Operation)

First, the read operation in which the word line WL0 is selected will be described. In this case, the predecode signal PD11a, and the predecode signals PD12 to PD14 are all on the "H" level (low power supply voltage VD), and the potential of the node N10a is set to the GND voltage VS. At this time, since each of the high power supply voltages VP and VP1 is the high-level intermediate voltage VM, the word line WL0 is driven with the high-level intermediate voltage VM.

In addition, since the load current control signal SL1 and the load current control signal SL2e (SL2ae, SL2be) have been each set to the low power supply voltage VD, the driving ability of each of the PMOS transistors QP15a and QP16a is reduced to reduce the load current to a low value. Therefore, lower power consumption can be achieved by suppressing a through current flowing to the GND voltage VS (the ground level defining the GND voltage VS) of the NAND gate G11 when the word line WL0 is selected. As a result, it is possible to reduce the size of the NMOS transistor (the NAND gate G1, the NMOS transistor QN1) for the extraction of the load current to the minimum necessary, and also reduce a layout area.

Thereafter, when the voltage of the predecode signal PD11a becomes the GND voltage VS, and the word line WL0 shifts to the non-selected state, a transition of the node N10a rising from the GND voltage VS to the high-level intermediate voltage VM is delayed due to the load current reduced by the PMOS transistors QP15a and QP16a.

However, the load current control signal SL3 that has been set to the high-level intermediate voltage VM during a selection period generates a pulse of the GND voltage VS during an initial predetermined period of a non-selection period. As a result, the PMOS transistor QP17a is brought into the ON state during the initial predetermined period of the non-selection period to allow the load current supplied from the load current generating portion 14a to the node N10a to be temporarily increased, and allow the node N10a to be set to the high-level intermediate voltage VM at a desired transition time. By thus rapidly performing switching from the selected state to the non-selected state, the first application example achieves the effect of allowing a high-speed read operation.

(Write Operation (Write Process, Write Verify Process))

Next, a write operation (write process, write verify process) in which the word line WL0 is selected will be described. That is, the description will be given of the case where the write process (write verify process) is performed with respect to the memory cell in the memory array 99a which is selected by the word line WL0.

In this case, the predecode signal PD11a, and the predecode signals PD12 to PD14 are all on the "H" level (low power supply voltage VD), and the potential of the node N10a is set to the GND voltage VS. At this time, since each of the high power supply voltages VP and VP1 is the over-ON-state-breakdown-voltage high voltage VH, the word line WL0 is driven with the over-ON-state-breakdown-voltage high voltage VH.

At this time, since the potential of the intermediate node 23a becomes the intermediate potential between the over-ON-state-breakdown-voltage high voltage VH and the potential of the node N10a, there is no degradation of the reliability of the decoder circuit of the first application example as long as the source-drain voltage Vds of each of the PMOS transistors QP15a and QP16d can be suppressed to a value of not more than the ON-state breakdown voltage.

Since the load current control signal SL3 (SL3a, SL3b) is set to the over-ON-state-breakdown-voltage high voltage VH during the write process, the PMOS transistor QP17a is in the normally-OFF state. This allows the problem associated with the ON-state breakdown voltage of MOS transistor QP17a to be technically avoided.

Therefore, during the write process in the state where the word line WL0 is selected, the node N10a is charged with the load current from each of the PMOS transistors QP15a and QP16a each in the ON state to the over-ON-state-breakdown-voltage high voltage VH. As a result, the NMOS transistor QN22 of the inverter G12a is turned ON to drive the word line WL0 with the GND voltage VS.

At this time, since the PMOS transistor QP17a is held in the normally-OFF state, it is impossible to rapidly perform switching from the selected state to the non-selected state, unlike in the read operation.

However, because the operation frequency of a decoder is typically lower in speed during the write operation or the erase operation than during the read operation, there is little need to rapidly perform switching from the selected state to the non-selected state during the write process.

During the write process, the load current control signal SL1 is set to the low power supply voltage VD, the load current control signal SL2e is set to the high-level intermediate voltage VM, and the load current control signal SL3 is set to the over-ON-state-breakdown-voltage high voltage VH.

During the write process, the high power supply voltage VP is set to the over-ON-state-breakdown-voltage high voltage VH so that the driving ability of each of the PMOS transistors QP15a and QP16a is increased. However, by setting the load current control signal SL2e to the high-level intermediate voltage VM, it is possible to reduce the driving ability of each of the PMOS transistors QP15a and QP16a, and reduce the load current to a low value.

Lower power consumption can be achieved by suppressing a through current flowing from the load current generating portion 14a to the GND voltage VS of the NAND gate G11 while the word line WL0 is selected. At the same time, it is possible to reduce the sizes of the NMOS transistors (the NAND gate G1 and the NMOS transistor QN1) for the extraction of the load current to the minimum necessary, and also reduce a layout area.

(Erase Operation: Pre-Erase Write Process)

Because the pre-erase write process is performed in units of one erase block, the word lines of a selected block including the word line WL0 of concern are all selected. It is assumed herein that the word lines WL0 to WL3 correspond to the same selected block.

In this case, the predecode signals PD11a to PD11d and the predecode signals PD12 to PD14 are all on the "H" level (low power supply voltage VD), and the potentials of the nodes N10a to N10d are each set to the GND voltage VS. At this time, each of the high power supply voltages VP and VP1 is the over-ON-state-breakdown-voltage high voltage VH so that the word lines WL0 to WL3 are driven with the over-ON-state-breakdown-voltage high voltage VH.

At this time, the load current control signal SL1 is set to the low power supply voltage VD, and each of the load current control signal SL2e, the load current control signal SL2o, and the load current control signal SL3 is set to the over-ON-state-breakdown-voltage high voltage VH.

Therefore, the PMOS transistors QP15a to QP15d and the PMOS transistors QP17a to QP17d are each brought into the OFF state to stop the supply of the load currents from the load current generating portions 14a to 14d to the nodes N10a to N10d. That is, the PMOS transistors QP15a to QP15d are exceptionally brought into the OFF state.

Accordingly, it is sufficient for the NMOS transistors QN11a to QN11d and the NAND gate G11 to merely extract the charges accumulated in the nodes N10a to N10d, and there is no occurrence of a through current between the over-ON-state-breakdown-voltage high voltage VH and the GND voltage VS in the selected state. Therefore, it is possible to achieve lower power consumption.

On the other hand, when the word lines WL0 to WL3 correspond to a non-selected block, the load current control signal SL1 is set to the low power supply voltage VD, each of the load current control signal SL2e and the load current control signal SL2o is set to the GND voltage VS, and the load current control signal SL3 is set to the over-ON-state-breakdown-voltage high voltage VH.

Therefore, in the non-selected state, the PMOS transistors QP15a to QP15d and the PMOS transistors QP16a to QP16d are each brought into the ON state to allow the nodes N10a to N10d to be charged to the over-ON-state-breakdown-voltage high voltage VH.

(Erase Operation: Erase Process)

Because the erase process is performed in units of one erase block, the word lines of a selected block including the word line WL0 of concern are all selected. It is assumed herein that the word lines WL0 to WL3 correspond to the same selected block.

In this case, the predecode signals PD11a to PD11d and the predecode signals PD12 to PD14 are all on the "H" level (low power supply voltage VD), and the potentials of the nodes N10a to N10d are each set to the GND voltage VS. At this time, the high power supply voltage VP is set to the low-level intermediate voltage VL, the high power supply voltage VP1 is set to the GND voltage VS, and the negative-side power supply voltage VN is set to the negative-side high voltage VNH.

At this time, the load current control signal SL1 is set to the GND voltage VS, and each of the load current control signal SL2e, the load current control signal SL2o, and the load current control signal SL3 is set to the low-level intermediate voltage VL.

Therefore, in the selected state, the PMOS transistors QP15a to QP15d, the PMOS transistors QP16a to QP16d, and the PMOS transistors QP17a to QP17d are each brought into the OFF state to stop the supply of the load currents from the load current generating portions 14a to 14d to the nodes N10a to N10d. That is, the PMOS transistors QP15a to QP15d are exceptionally brought into the OFF state.

Accordingly, it is sufficient for the NMOS transistors QN11a to QN11d and the NAND gate G11 to extract the charges accumulated in the nodes N10a to N10d, and there is no occurrence of a through current between the over-ON-state-breakdown-voltage high voltage VH and the GND voltage VS in the selected state. Therefore, it is possible to achieve lower power consumption.

As a result, the NMOS transistor QN22a of the inverter G12a is turned ON to drive the word line WL0 with the negative-side high voltage VNH. To each of the source and well region of a memory transistor (not shown) coupled to the selected word line WL0, a high positive voltage is applied.

On the other hand, when the word lines WL0 to WL3 correspond to a non-selected block, each of the load current control signal SL1, the load current control signal SL2e, and the load current control signal SL2o is set to the GND voltage VS, and the load current control signal SL3 is set to the low-level intermediate voltage VL. The high power supply voltage VP is set to the low-level intermediate voltage VL, the high power supply voltage VP1 is set to the GND voltage VS, and the negative-side power supply voltage VN is set to the GND voltage VS.

Therefore, in the non-selected state, the PMOS transistors QP15a to QP15d and the PMOS transistors QP16a to QP16d are each brought into the ON state to allow the nodes N10a to N10d to be charged to the low-level intermediate voltage VL.

As a result, the NMOS transistor 22a of the inverter G12a is turned ON to drive the word line WL0 with the GND voltage VS. To each of the source and well region of the memory transistor (not shown) coupled to the non-selected word line WL0, the GND voltage VS is applied.

(Erase Operation: Erase Verify Process)

The erase verify process in which the word line WL0 is selected will be described. That is, the description will be given of the case where the erase verify process is performed with respect to a memory cell in the memory array 99a which is selected by the word line WL0.

In this case, the predecode signal PD11a, and the predecode signals PD12 to PD14 are all on the "H" level (low power supply voltage VD), and the potential of the node N10a is set to the GND voltage VS. At this time, each of the high power supply voltages VP and VP1 is the low-level intermediate voltage VL so that the word line WL0 is driven with the low-level intermediate voltage VL.

At this time, the load current control signal SL1 and the load current control signal SL2e are each set to the GND voltage VS, and the load current control signal SL3 is set to the low-level intermediate voltage VL.

On the other hand, when the word line WL0 is non-selected, the high power supply voltage VP is set to the low-level intermediate voltage VL, the high power supply voltage VP1 is set to the GND voltage VS, and the negative-side power supply voltage VN is set to the GND voltage VS.

Therefore, even when the high power supply voltage VP is the low-level intermediate voltage VL, the PMOS transistors QP15a and QP16a are each turned ON to allow a sufficient load current to be supplied from the load current generating portion 14a to the node N10a. As a result, the NMOS transistor QN22a is turned ON to drive the word line WL0 with the GND voltage VS.

(Summary)

Thus, the first application example can implement a stable operation of the decoder, and achieve lower power consumption by using the decoder circuit according to the third embodiment to perform optimized load current control for each of the operations of the flash memory, and thereby ensuring sufficient reliability for the ON-state breakdown voltage of each of the PMOS transistors configuring the load current generating portion. In particular, the first operation example achieves the effect of allowing high-speed processing of the read operation as well as a highly reliable decoding operation during the write process.

-Layout Configuration-

FIG. 11 is an illustrative view schematically showing a layout configuration for implementing the circuit portion shown in FIG. 6 in the first application example. As shown in the drawing, a low-voltage-portion formation region A1, an extraction-NMOS formation region A2, a load-current-generating-portion formation region A3, and a word-line-driving-inverter formation region A4 are provided. The word-line-driving-inverter formation region A4 is comprised of a PMOS formation region PM1, an NMOS formation region NM1, and a PMOS formation region PM2.

Each of the extraction-NMOS formation region A2 and the load-current-generating-portion formation region A3 is provided with a MOS transistor in which the lateral direction and the longitudinal direction in the drawing are assumed to be a gate length direction L and a gate width direction W, respectively. On the other hand, the word-line-driving-inverter formation region A4 is provided with a MOS transistor in which the lateral direction and the longitudinal direction in the drawing are assumed to be the gate width direction W and the gate length direction L, respectively. Since the word-line-driving-inverter formation region A4 is a portion coupled directly to the word line WL, the layout configuration thereof is limited by a word line pitch (wiring region defined by the word lines).

FIGS. 12A and 12B are plan views each showing an actual layout configuration corresponding to the four word lines WL0 to WL3 in the word-line-driving-inverter formation region A4 shown in FIG. 11, of which FIG. 12A shows a layout configuration of the word-line-driving-inverter formation region A4, and FIG. 12B shows a circuit diagram of the inverter G12 (G12a to G12d) equivalent thereto.

The PMOS formation region PM1 is provided with P-type active regions 51 and 52. The NMOS formation region NM1 is provided with N-type active regions 53 to 56. The PMOS formation region PM2 is provided with P-type active regions 57 and 58. Over the respective active regions 51 to 58, gate wirings LG (serving also as gate electrodes) are provided.

Therefore, in the PMOS formation region PM1, the gate wiring LG and the active region 51 configure the PMOS transistor QP22a, and the gate wiring LG and the active region 52 configure the PMOS transistor QP22c.

Likewise, in the PMOS formation region PM2, the gate wiring LG and the active region 57 configure the PMOS transistor QP22d, and the gate wiring LG and the active region 58 configure the PMOS transistor QP22b.

In the NMOS formation region NM1, the gate wiring LG and the active region 53 configure the NMOS transistor QN22c, and the gate wiring LG and the active region 54 configure the NMOS transistor QN22a. Further, the gate wiring LG and the active region 55 configure the NMOS transistor QN22b, and the gate wiring LG and the active region 56 configure the NMOS transistor QN22d.

The node N10a (first wiring LY1) is coupled to each of the gate wiring LG over the active region 51 and the gate wiring LG over the active region 54 via contact holes CHG1. That is, the node N10a is electrically coupled to the gate electrode of each of the PMOS transistor QP22a and the NMOS transistor QN22a.

The node N10b (second wiring LY2) is coupled to each of the gate wiring LG over the active region 55 and the gate wiring LG over the active region 58 through the mediation of through holes TH12 and the first wiring LY1 via the contact holes CHG1. That is, the node N10b is electrically coupled to the gate electrode of each of the PMOS transistor QP22b and the NMOS transistor QN22b.

The node N10c (first wiring LY1) is coupled to each of the gate wiring LG over the active region 52 and the gate wiring LG over the active region 53 via the contact holes CHG1. That is, the node N10c is electrically coupled to the gate electrode of each of the PMOS transistor QP22c and the NMOS transistor QN22c.

The node N10d (second wiring LY2) is coupled to each of the gate wiring LG over the active region 55 and the gate wiring LG over the active region 58 through the mediation of the through holes TH12 and the first wiring LY1 via the contact holes CHG1. That is, the node N10d is electrically coupled to the gate electrode of each of the PMOS transistor QP22d and the NMOS transistor QN22d.

The word line WL0 (second wiring LY2) is coupled to the active regions 54 and 51 via contact holes CH2. That is, the word line WL0 is electrically coupled to the drain of each of the PMOS transistor QP22a and the NMOS transistor QN22a.

The word line WL1 (second wiring LY2) is coupled to the active regions 58 and 55 via the contact holes CH2. That is, the word line WL1 is electrically coupled to the drain of each of the PMOS transistor QP22b and the NMOS transistor QN22b.

The word line WL2 (second wiring LY2) is coupled to the active regions 53 and 52 through the mediation of the through holes TH12 and the first wiring LY1 via contact holes CH1. That is, the word line WL2 is electrically coupled to the drain of each of the PMOS transistor QP22c and the NMOS transistor QN22c.

The word line WL3 (second wiring LY2) is coupled to the active regions 57 and 56 through the mediation of the through holes TH12 and the first wiring LY1 via the contact holes CH1. That is, the word line WL3 is electrically coupled to the drain of each of the PMOS transistor QP22d and the NMOS transistor QN22d.

A high power supply voltage line LVP1 (second wiring LY2) is coupled to the active regions 51 and 52 via the contact holes CH2. That is, the high power supply voltage line LVP1 is electrically coupled to the source of each of the PMOS transistors QP22a and QP22c.

A high power supply voltage line LVP2 (second wiring LY2) is coupled to the active regions 57 and 58 via the contact holes CH2. That is, the high power supply voltage line LVP2 is electrically coupled to the source of each of the PMOS transistors QP22b and QP22d.

A negative-side power supply line LVN (second wiring LY2) is coupled to the active regions 53 to 56 via the contact holes CH2. That is, the negative-side power supply line LVN is electrically coupled to the source of each of the NMOS transistors QN22a to QN22d.

In an actual situation, the high power supply voltage lines LVP1 and LVP2 and the negative-side power supply line LVN are each provided with a third wiring not shown in the drawings so that the high power supply voltage VP1 and the negative-side power supply voltage VN are supplied via the third wirings.

Thus, the PMOS transistors QP22a to QP22d and the NMOS transistors QN22a to QN22d which configure the inverters G12a to G12d can be laid out to be contained within the wiring regions LA to LA4 (four pitches) for the four word lines WL0 to WL3.

In other words, the wiring regions LA1 and LA3 are positively used as the wiring regions for the nodes N10a to N10d, while the wiring region LA2 and the respective vacant areas of the wiring regions LA1 and LA3 are used as the wiring regions for the word lines WL0 to WL3. In addition, the wiring region LA4 is used as the wiring region for the high power supply voltage lines LVP1 and LVP2 and the negative-side power supply line LVN.

Figures 13A, 13B:
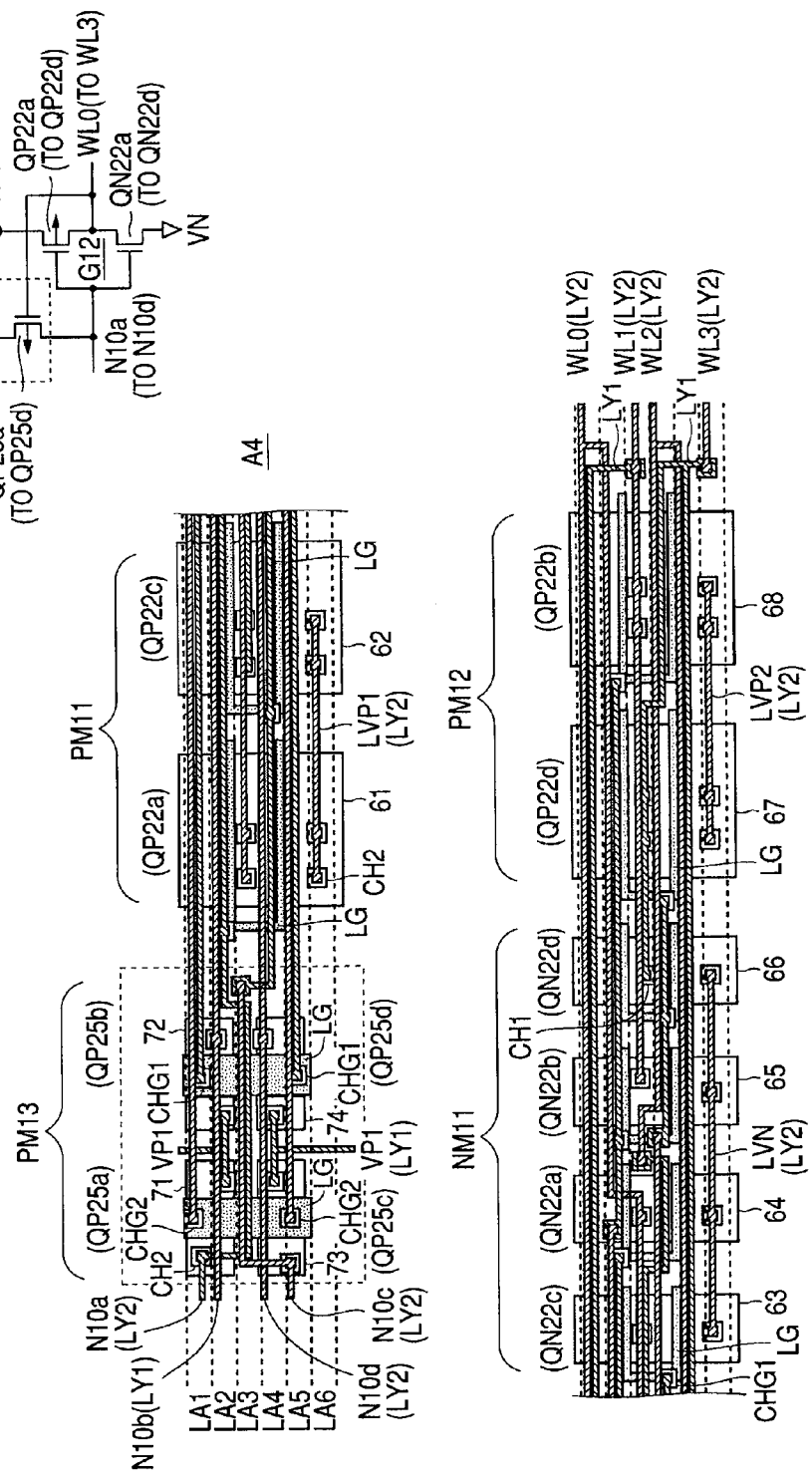
FIGS. 13A and 13B are illustrative views each showing a layout configuration for comparison with FIG. 12.

FIGS. 13A and 13B are illustrative views each showing a layout configuration of a comparative inverter circuit for comparison with FIG. 12. As shown in FIG. 13B, there are further provided PMOS transistors QP25a (to QP25d) serving as half latches in which gate electrodes receive the word lines WL0 (to WL3). In the PMOS transistor QP25a, a source receives the high power supply voltage VP, and a drain is coupled to the nodes N10a (to N10d). That is, the circuit shown in FIG. 13B exhibits the same structure as that of the second conventional circuit shown in FIG. 19.

As shown in FIG. 13A, a PMOS formation region PM11 is provided with P-type active regions 61 and 62, an NMOS formation region NM11 is provided with N-type active regions 63 to 66, and a PMOS formation region PM12 is provided with P-type active regions 67 and 68. Over the respective active regions 61 to 68, the gate wirings (serving also as the gate electrodes) are provided.

Further, a PMOS formation region PM13 is provided with active regions 71 to 74, and the gate wirings LG are provided over the respective active regions 71 to 74.

Therefore, in the PMOS formation region PM11, the gate wiring LG and the active region 61 configure the PMOS transistor QP22a, and the gate wiring LG and the active region 62 configure the PMOS transistor QP22c.

Likewise, in the PMOS formation region PM12, the gate wiring LG and the active region 67 configure the PMOS transistor QP22d, and the gate wiring LG and the active region 68 configure the PMOS transistor QP22b.

In the NMOS formation region NM11, the gate wiring LG and the active region 63 configure the NMOS transistor QN22c, and the gate wiring LG and the active region 64 configure the NMOS transistor QN22a. Additionally, the gate wiring LG and the active region 65 configure the NMOS transistor QN22b, and the gate wiring LG and the active region 66 configure the NMOS transistor QN22d.

Further, in the PMOS formation region PM13, the gate wiring LG and the active region 71 configure the PMOS transistor QP25a, and the gate wiring LG and the active region 72 configure the PMOS transistor QP25b. Additionally, the gate wiring LG and the active region 73 configure the PMOS transistor QP25c, and the gate wiring LG and the active region 74 configure the PMOS transistor QP25d.

As for the electrical couplings between the nodes N10a to N10d or the word lines WL0 to WL3 and the PMOS transistors QP22a to QP22d and the NMOS transistors QN22a to QN22d, they are substantially the same as in the first application example shown in FIG. 12 so that the description thereof will be omitted.

In the comparative inverter, it is not only necessary to provide the layout shown in FIG. 12, but also couple the PMOS transistors QP25a to QP25d to the word lines WL0 to WL3 and to the nodes N10a to N10d. Accordingly, each of the word lines WL0 to WL3 needs to be branched. Hereinbelow, a detailed description will be given of the need.

For example, the word line WL0 is formed to be branched for coupling to the drains of the PMOS transistor QP22a and the NMOS transistor QN22a, and for coupling to the gate wiring LG over the active region 71 via a contact hole CHG2. The former branch of the word line WL0 is formed in the wiring regions LA2 and LA3, while the latter branch thereof is formed in the wiring region LA1.

The word line WL1 is formed to be branched for coupling to the PMOS transistor QP22b and the NMOS transistor QN22b, and for coupling to the gate wiring LG over the active region 72 via the contact hole CHG1. The former branch of the word line WL1 is formed in the wiring region LA3, while the latter branch thereof is formed in the wiring region LA1.

The word line WL2 is formed to be branched for coupling to the drains of the PMOS transistor QP22c and the NMOS transistor QN22c, and for coupling to the gate wiring LG over the active region 73 via the contact hole CHG2. The former branch of the word line WL2 is formed in the wiring regions LA3 and LA4, while the latter branch thereof is formed in the wiring region LA5.

A word line WL4 is formed to be branched for coupling to the PMOS transistor QP22d and the NMOS transistor QN22d, and for coupling to the gate wiring LG over the active region 74 via the contact hole CHG1. The former branch of the word line WL4 is formed in the wiring regions LA3, LA4, and LA6, while the latter branch thereof is formed in the wiring region LA5.

Thus, in the comparative inverter circuit, each of the word lines WL0 to WL3 needs to be formed to be branched so that the portion where the four word lines WL0 to WL3 are formed is formed with a width (6 pitches) for forming six word lines. As a result, unlike in FIG. 12, the vertical size of the layout cannot be suppressed to undesirably increase the scale of the circuit configuration.

That is, the wiring regions LA2 and LA4 are positively used as the wiring regions for the nodes N10a to N10d, and the vacant regions of the wiring region LA3 and the wiring regions LA2 and LA4 are used primarily as wiring regions for the coupling of the word lines WL to the PMOS transistors QP22a to QP22d and the NMOS transistors QN22a to QN22d.

Further, the wiring regions LA1 and LA5 are used as the wiring regions for the coupling of the word line WL to the PMOS transistors QP25a to QP25d, and the wiring region LA6 is used as the wiring region for the high power supply voltage lines LVP1 and LVP2 and the negative-side power supply line LVN.

In addition, since the vertical size of the layout in the decoder circuit of the third embodiment can be reduced in the first application example to a size equivalent to the word lines (wiring regions LA1 to LA4), there is no increase in the scale of the circuit configuration.

Thus, as is obvious from the comparison between FIGS. 12 and 13, in the first application example using the decoder circuit according to the third embodiment, half latch circuits (corresponding to the PMOS transistors QP25a to QP25d) need not be provided so that the effect of allowing the layout to be formed in accordance with the pitch (wiring regions) of the word lines is achieved. Accordingly, there is no increase in design cost resulting from the provision of the half latch circuits mentioned above.

Application Example 2

Figure 14:
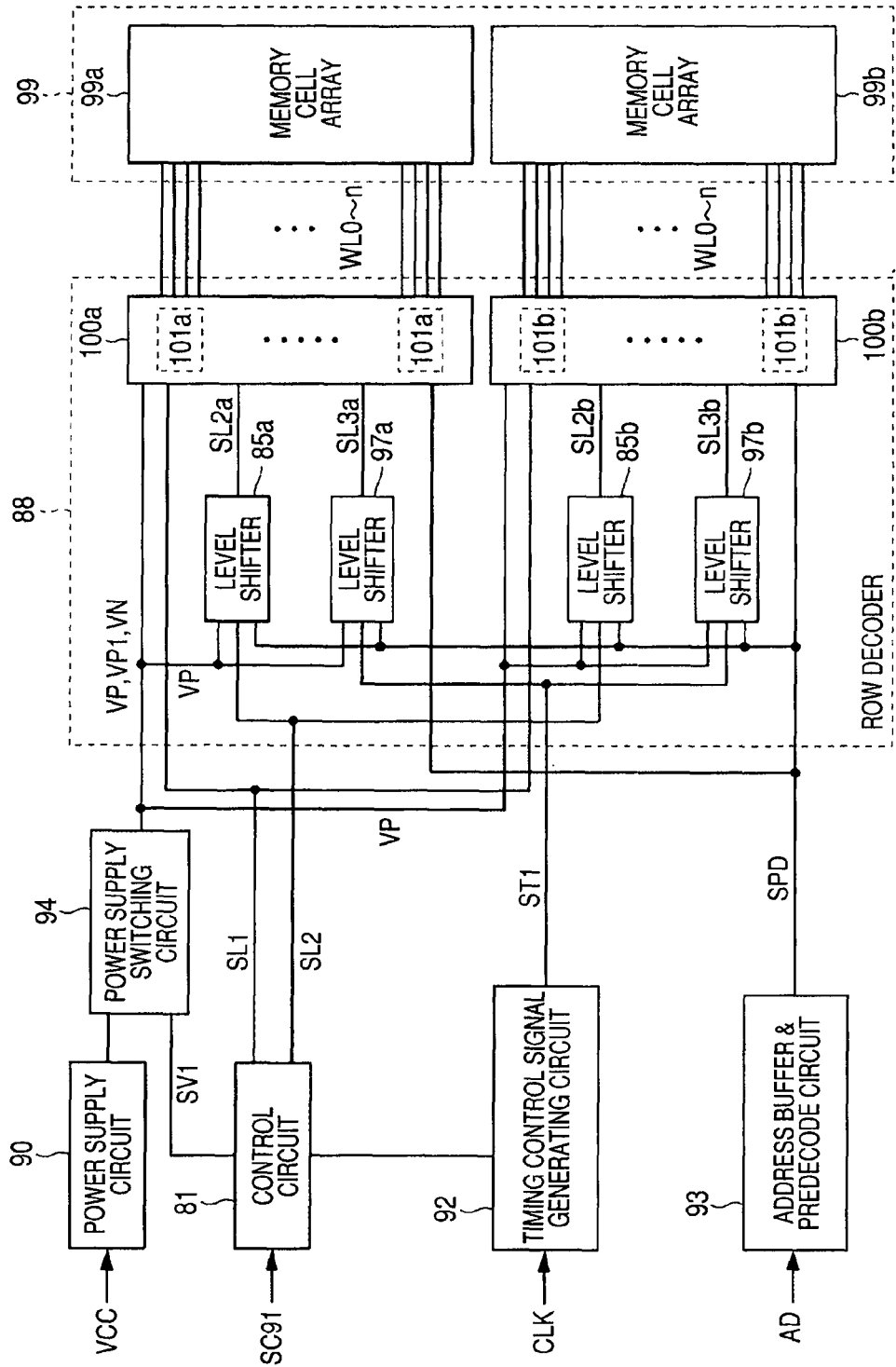
FIG. 14 is a block diagram showing the portion of a flash memory as a second application example using the decoder circuit according to the third embodiment which is related to a row decoder portion.

FIG. 14 is a block diagram showing the portion of a flash memory as a second application example using the decoder circuit according to the third embodiment which is related to a row decoder portion. That is, FIG. 14 shows a circuit configuration including input signals such as an address signal SAD and the control signal SC91, a row decoder 88, the memory array set 99, and the circuits interposed between the input signals and the row decoder 88.

Figure 15:
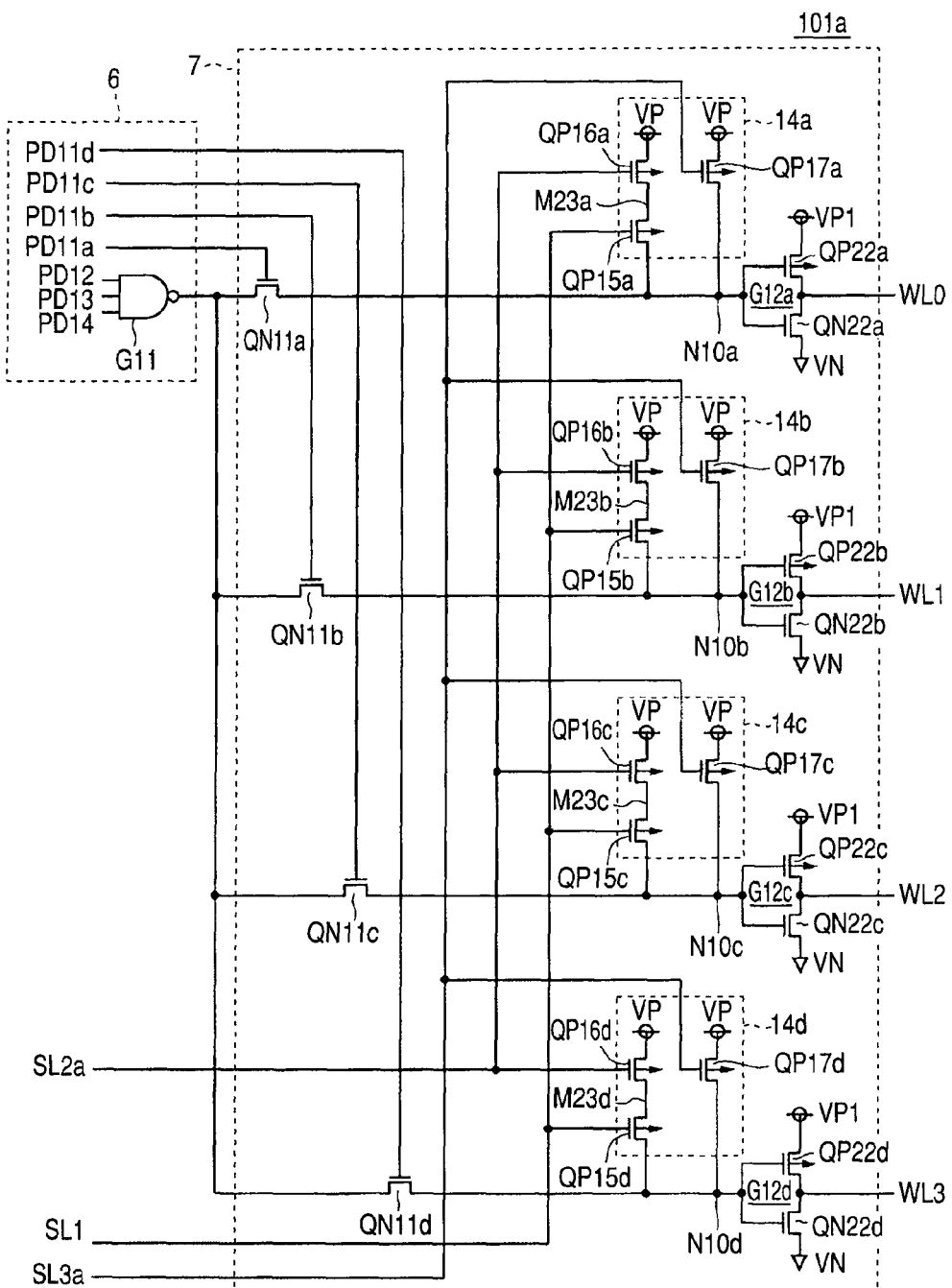
FIG. 15 is a circuit diagram showing a part of FIG. 14 in detail.
Figure 17:
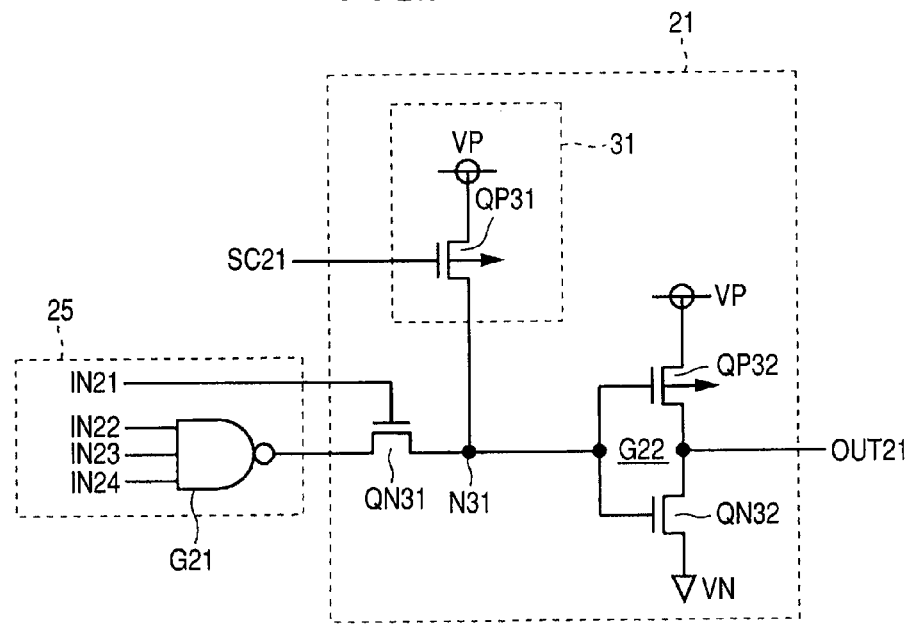
FIG. 17 is a circuit diagram showing a structure of a part of a decoder circuit as a first conventional circuit.
Figure 18:
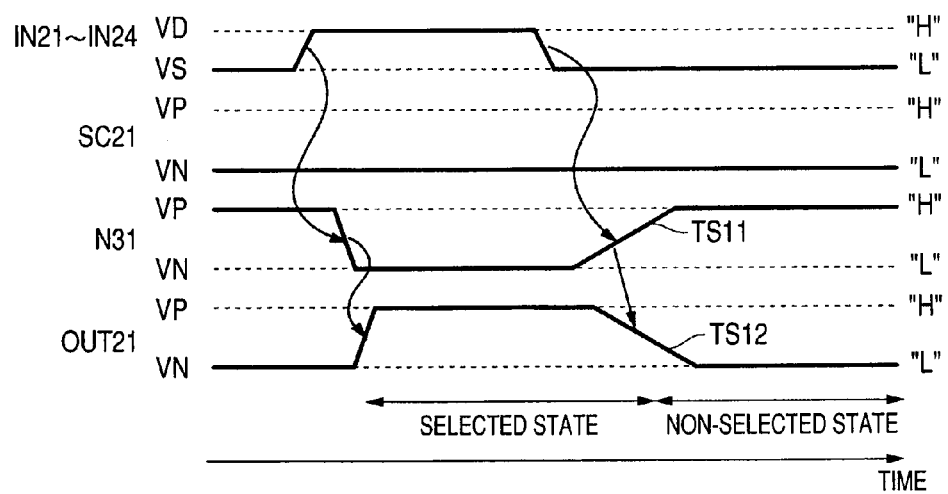
FIG. 18 is a waveform diagram showing an operation of the first conventional circuit.

FIG. 15 is a circuit diagram showing a part (corresponding the word lines WL0 to WL3 of the memory array 99*a*) of FIG. 14 in detail. That is, FIG. 15 is a circuit diagram showing the partial word line driving circuit 101*a* corresponding to the fourth word lines WL0 to WL3.

In such a structure as shown in FIGS. 14 and 15, the decoder circuit of the third embodiment is adopted in the final stage of the row decoder of the flash memory.

As depicted in FIG. 14, a structure is shown in which two memory array blocks (memory arrays 99*a* and 99*b*) are controlled as the row decoder 88. The decoder corresponding to the memory arrays 99*a* and 99*b* is constructed by disposing the partial word line driving circuits 101*a* (101*b*) shown in FIG. 10 such that the number thereof corresponds to that of the word lines WL.

As for the same parts as in the first application example shown in FIGS. 5 and 6, the description thereof will be omitted hereinbelow by providing the same reference numerals.

A control circuit 81 outputs a power supply select signal SV1 and the load current control signals SL1 and SL2 to the row decoder 88 based on the control signal SC91.

The row decoder 88 is comprised of level shifters 85*a* and 97*a*, the word line driving circuit 100*a*, level shifters 85*b* and 97*b*, and the word line driving circuit 100*b*.

The level shifter 85*a* receives the high power supply voltages VP and VP1, and outputs the load current control signal SL2*a* which has been level-shifted to the high power supply voltage VP (VP1) based on the load current control signal SL2 and the predecode signal SPD.

The word line driving circuit 100*a* receives various voltages such as the high power supply voltages VP and VP1, and drives the word line in the selected state which is among the word lines WL0 to WLn of the memory array 99*a* based on the load current control signal SL3*a* and the predecode signal SPD.

Because the level shifter 85*b* and the word line driving circuit 100*b* have structures equivalent to those of the level shifter 85*a* and the word line driving circuit 100*a*, they perform the same operations as the level shifter 85*a* and the word line driving circuit 100*a* each described above.

That is, the load current control signal SL2*b* and the load current control signal SL3*b* are obtained from the level shifters 85*b* and 97*b* and, based on these signals, the word line driving circuit 100*b* drives the word line in the selected state which is among the word lines WL0 to WLn of the memory array 99*b*.

As shown in FIG. 15, the partial word line driving circuit 101*a* corresponding to the word lines WL0 to WL3 is comprised of the high-voltage circuit portion 7 and the low-voltage circuit portion 6. The high-voltage circuit portion 7 performs a high-voltage operation, similarly to the high-voltage circuit portion 3. The low-voltage circuit portion 6 performs a low-voltage operation, similarly to the low-voltage circuit portion 5.

The low-voltage circuit portion 6 is comprised of the 3-input NAND gate G11, receives the predecode signals PD12 to PD14, and outputs the output signal thereof to the high-voltage circuit portion 7. The predecode signals PD11a to PD11d are directly outputted to the high-voltage circuit portion 7 without any alteration. The predecode signals PD11a to PD11d and PD12 to PD14 mentioned above correspond to a part of the predecode signal SPD shown in FIG. 14.

The high-voltage circuit portion 7 is comprised of the load current generating portions 14a to 14d, the NMOS transistors QN11a to QN11d, and the inverters G12a to G12d. The load current generating portions 14a to 14d, the NMOS transistors QN11a to QN11d, and the inverters G12a to G12d are provided correspondingly to the word lines WL0 to W13.

Hereinbelow, a description will be given primarily of the load current generating portion 14a, the NMOS transistor QN11a, and the inverter G12a.

In the NMOS transistors QN11a to QN11d, the one electrodes commonly receive the output of the NAND gate G11, the other electrodes are coupled to the nodes N10a to 10d, and the gate electrodes receive the predecode signals PD11a to PD11d.

The load current generating portion 14a is comprised of the PMOS transistors QP15a to QP17a. In the PMOS transistor QP16a, the one electrode receives the high power supply voltage VP, the gate electrode receives the load current control signal SL2a, and the other electrode serves as the intermediate node M23a.

In the PMOS transistor QP15a, the one electrode is coupled to the other electrode (intermediate node M23a) of the PMOS transistor QP16a, the gate electrode receives the load current control signal SL1, and the other electrode is coupled to the node 10a, i.e., the one electrode of the NMOS transistor QN11a.

In the PMOS transistor QP17a, the one electrode receives the high power supply voltage VP, the gate electrode receives the load current control signal SL3a, and the other electrode is coupled to the node N10a. The load current generating portions 14b to 14d are also similarly constructed to the load current generating portion 14a.

The second application example is also designed to satisfy the first operation condition under which, when the output of the NAND gate G11 is on the "L" level (GND voltage VS), the ("L"-level) driving forces of the NAND gate G11 and the NMOS transistor QN11a exceed the driving forces of the PMOS transistors QP15a and QP16a to forcibly set the node N10a to the GND voltage VS.

The load current generating portions 14b to 14d, the NMOS transistors QN11b to QN11d, and the inverters G12b to G12d provided correspondingly to the word lines WL1 to WL3 are also similarly constructed to the load current generating portion 14a, the NMOS transistor QN11a, and the inverter G12a provided corresponding to the word line WL0.

FIG. 16 is an illustrative view showing the settings of various power supply voltages and control signals in a read operation, a write operation, and an erase operation in a tabular form.

As shown in the drawing, in the selected state, the load current control signal SL2 (SL2a, SL2b) is set to the low power supply voltage VD during the read operation, to the high-level intermediate voltage VM during the write operation, to the over-ON-state-breakdown-voltage high voltage VH during the pre-erase write process, to the low-level intermediate voltage VL during the erase process, and to the GND voltage VS during the erase verify process.

In the non-selected state, the load current control signal SL2 is set to the low power supply voltage VD during the read operation, to the high-level intermediate voltage VM during the write operation, and to the GND voltage VS during the erase operation.

The settings of the high power supply voltage VP, the high power supply voltage VP1, the load current control signal SL1, the load current control signal SL2, and the negative-side power supply voltage VN are the same as in the first application example shown in FIG. 10.

Therefore, even in the second application example, the read operation, the write operation (the write process, the write verify process), and the erase operation (the pre-erase write process, the erase process, the erase verify process) are performed in substantially the same manner as in the first application example.

Although the structure using the decoder circuit according to the third embodiment has been shown as each of the first and second application examples, it will be easily appreciated that a structure similarly using the decoder circuit according to the first embodiment or the second embodiment can also be used. In the case of using the decoder circuit according to the second embodiment, the effect of allowing, e.g., high-speed processing of the read operation is achieved. In the case of using the decoder circuit according to the first embodiment, the effect of allowing, e.g., a highly reliable decoding operation during the write process is achieved.

Because the present invention can ease the limit on the voltage level of the high power supply voltage VP (VP1), and increase the voltage level to a value of not less than the ON-state breakdown voltage of each of the PMOS transistors of the load current generating portion, it is applicable to a decoder circuit for a flash memory which is a semiconductor memory device using a high voltage level for memory cell control or the like. The present invention ensures an operation speed by reducing a non-selection transition time, while controlling a load current and achieving lower power consumption, and is applicable to a semiconductor memory device of which both lower power consumption and an ensured operation speed are required, or to a memory module in which a microcomputer is embedded and a layout reduction is required of a decoder circuit.

What is claimed is:

1. A decoder circuit which defines selection/non-selection of an object to be controlled with an output signal, the decoder circuit comprising:
   a high voltage imparting portion which imparts a high voltage to a potential setting node;
   a low voltage setting portion which determines presence or absence of a selected state based on an input signal, and forcibly sets the potential setting node to a low voltage lower than the high voltage during the selected state; and
   an output signal driving portion which outputs the output signal on a voltage level including the high voltage and the low voltage based on a voltage obtained from the potential setting node,
   wherein the high voltage imparting portion imparts the high voltage to the potential setting node via first and second switching transistors coupled in series via an intermediate node which is not directly connected to the output signal driving portion,
   wherein the low voltage setting portion includes a third switching transistor set to a ON state to impart the low voltage to the potential setting node during the selected state, and wherein a driving force of the third switching transistor exceeds driving forces of the first and second transistors during the selected state.

2. A decoder circuit according to claim 1, wherein the high voltage includes an over-ON-state-breakdown-voltage high voltage of not less than an ON-state breakdown voltage of each of the first and second switching transistors.

* * * * *